US009097586B2

(12) United States Patent
Bleier et al.

(10) Patent No.: US 9,097,586 B2
(45) Date of Patent: Aug. 4, 2015

(54) QUASI-TRANSLATOR, FOURIER MODULATOR, FOURIER SPECTROMETER, MOTION CONTROL SYSTEM AND METHODS FOR CONTROLLING SAME, AND SIGNAL PROCESSOR CIRCUIT

(71) Applicant: FTRX LLC, Deer Park, NY (US)

(72) Inventors: Zvi Bleier, Lloyd Harbor, NY (US); Alexander Jacobson, Deer Park, NY (US); Drouét Warren Vidrine, San Clemente, CA (US); Jack Gordon Kisslinger, Madison, WI (US)

(73) Assignee: PLX, Inc., Deer Park, NY (US)

( * ) Notice: Subject to any disclaimer, the term of this patent is extended or adjusted under 35 U.S.C. 154(b) by 505 days.

(21) Appl. No.: 13/682,983

(22) Filed: Nov. 21, 2012

(65) Prior Publication Data

US 2013/0135026 A1 May 30, 2013

Related U.S. Application Data

(63) Continuation of application No. 13/682,857, filed on Nov. 21, 2012, which is a continuation of application No. 13/682,801, filed on Nov. 21, 2012.

(60) Provisional application No. 61/563,109, filed on Nov. 23, 2011.

(51) Int. Cl.
*H03L 5/00* (2006.01)
*G01J 3/45* (2006.01)
(Continued)

(52) U.S. Cl.
CPC ................. *G01J 3/45* (2013.01); *G01B 21/047* (2013.01); *G01J 3/4535* (2013.01); *G02B 26/00* (2013.01);
(Continued)

(58) Field of Classification Search
None
See application file for complete search history.

(56) References Cited

U.S. PATENT DOCUMENTS 2,626,771 A 1/1953 Krohm
3,310,264 A 3/1967 Appleton
(Continued)

FOREIGN PATENT DOCUMENTS

WO 2007120476 A2 10/2007
WO 2013078281 A2 5/2013

OTHER PUBLICATIONS

International Search Report and Written Opinion, dated Jul. 14, 2008 for International Application No. PCT/US07/08103, filed: Apr. 3, 2007.
(Continued)

*Primary Examiner* — Lincoln Donovan
*Assistant Examiner* — Khareem E Almo
(74) *Attorney, Agent, or Firm* — Pergament Gilman & Cepeda LLP

(57) ABSTRACT

A quasi-translator for economically producing pure, smooth translational motion with broad arcuate or error-free motion regardless of orientation, which is useful in numerous interferometer applications including spectroscopy, a Fourier modulator and a Fourier spectrometer are provided. The quasi-translator utilizes a support, an arm including a driving magnet on a first end and a driven element on a second end, an axis for rotation of the arm, a bearing system that controls the rotation of the arm about the axis, a drive coil and a drive amplifier to drive the arm in the arcuate motion. The quasi-translator may be employed in a Fourier modulator to change the optical path difference of the interferometer/quasi-translator at a substantially constant rate of change. The quasi-translator and/or Fourier modulator may be used in a Fourier spectrometer to create an optical spectrum from a light beam and/or electrical signal created from the light beam.

10 Claims, 14 Drawing Sheets

(51) Int. Cl.
*G02B 26/00* (2006.01)
*G05B 6/02* (2006.01)
*H02K 33/16* (2006.01)
*G01B 21/04* (2006.01)
*G05B 15/02* (2006.01)
*G01J 3/453* (2006.01)
*G02B 5/122* (2006.01)
*G02B 26/12* (2006.01)

(52) U.S. Cl.
CPC *G05B 6/02* (2013.01); *G05B 15/02* (2013.01); *H02K 33/16* (2013.01); *H03L 5/00* (2013.01); *G02B 5/122* (2013.01); *G02B 26/12* (2013.01)

(56) References Cited

U.S. PATENT DOCUMENTS 3,526,381 A 9/1970 Pepe
3,663,084 A 5/1972 Lipkins
3,667,718 A 6/1972 Goslin et al.
3,832,072 A 8/1974 Mazur
3,977,765 A 8/1976 Lipkins
4,025,792 A 5/1977 Harries
4,193,693 A 3/1980 Schindler
4,383,205 A 5/1983 Guisinger
4,383,762 A 5/1983 Burkert
4,479,625 A 10/1984 Martz
4,556,316 A 12/1985 Doyle
4,635,887 A 1/1987 Hall et al.
4,710,001 A 12/1987 Lacey
4,773,757 A 9/1988 Doyle
4,810,092 A 3/1989 Auth
4,815,836 A 3/1989 Byers et al.
4,914,297 A 4/1990 Wieboldt et al.
4,915,502 A 4/1990 Brierley
4,918,306 A 4/1990 Saito
4,991,961 A 2/1991 Strait
5,002,394 A 3/1991 Auth
5,122,901 A 6/1992 Bleier
5,196,902 A 3/1993 Solomon
5,239,361 A 8/1993 Burch
5,335,111 A 8/1994 Bleier
5,349,438 A 9/1994 Solomon
5,440,143 A 8/1995 Carangelo et al.
5,486,917 A 1/1996 Carangelo et al.
5,521,698 A 5/1996 Carroll et al.
5,543,916 A 8/1996 Kachanov
5,610,706 A 3/1997 Carroll et al.
5,678,409 A 10/1997 Price
5,808,739 A 9/1998 Turner et al.
5,861,956 A 1/1999 Bridges et al.
5,949,543 A 9/1999 Bleier et al.
5,949,544 A 9/1999 Manning
6,062,697 A 5/2000 Bryant et al.
6,141,101 A 10/2000 Bleier et al.
6,246,052 B1 6/2001 Cleveland et al.
6,302,585 B1 10/2001 Lee et al.
6,402,330 B1 6/2002 Scheidegg
6,453,566 B1 9/2002 Bottinelli et al.
6,473,185 B2 10/2002 Vishnia et al.
6,522,459 B1 * 2/2003 Pease et al. ................ 359/341.4
6,639,742 B2 10/2003 Snively et al.
6,657,196 B2 12/2003 Endo et al.
6,729,735 B2 5/2004 Bleier
6,752,503 B2 6/2004 Bleier
6,786,608 B1 9/2004 Bleier
6,827,455 B2 12/2004 Bleier
6,836,968 B1 1/2005 Walker et al.
6,937,347 B2 8/2005 Erwin
6,940,598 B2 9/2005 Christel et al.
6,945,661 B2 9/2005 Bleier
7,116,871 B2 10/2006 Sullivan et al.
7,168,817 B2 1/2007 Bleier et al.
7,224,464 B2 5/2007 Manning
7,265,369 B2 9/2007 Maruo
7,268,960 B2 9/2007 Vishnia
7,275,332 B2 10/2007 Blanding
7,355,697 B2 4/2008 Mertz et al.
7,535,572 B2 5/2009 Englert
7,623,234 B2 11/2009 Puzey
7,630,081 B2 12/2009 Ressler et al.
7,835,077 B2 11/2010 Rosenqvist
7,894,055 B2 2/2011 Mertz et al.
7,894,057 B2 2/2011 Puzey
7,995,208 B2 8/2011 Jacobson et al.
8,092,030 B2 1/2012 Bleier
8,120,853 B2 2/2012 Jacobson et al.
8,205,852 B2 6/2012 Jacobson et al.
8,205,853 B2 6/2012 Jacobson et al.
8,454,176 B2 6/2013 Bleier
8,567,968 B2 10/2013 Bleier
9,007,679 B2 * 4/2015 Taverner ...................... 359/333
2003/0007155 A1 1/2003 Ota
2003/0048533 A1 3/2003 Lyons, III
2003/0142929 A1 * 7/2003 Bartur et al. .................... 385/92
2005/0008298 A1 1/2005 Sullivan et al.
2005/0094155 A1 5/2005 Hill et al.
2007/0295155 A1 12/2007 Bleier
2008/0170231 A1 7/2008 Ressler et al.
2010/0012808 A1 1/2010 Jacobson et al.
2010/0033728 A1 2/2010 Jacobson et al.
2011/0273778 A1 11/2011 Jacobson et al.
2011/0308060 A1 12/2011 Bleier
2011/0310504 A1 12/2011 Bleier
2012/0091310 A1 4/2012 Jacobson et al.
2012/0113522 A1 5/2012 Jacobson et al.
2012/0218654 A1 8/2012 Bleier et al.
2013/0135026 A1 5/2013 Bleier et al.
2013/0135622 A1 5/2013 Bleier et al.
2013/0138226 A1 * 5/2013 Bleier et al. .................... 700/66
2013/0167353 A1 7/2013 Bleier
2013/0326862 A1 12/2013 Bleier
2014/0029009 A1 1/2014 Bleier et al.
2014/0029010 A1 1/2014 Bleier et al.

OTHER PUBLICATIONS

International Search Report and Written Opinion, dated Mar. 27, 2013, for International Application No. PCT/US12/66219, filed: Nov. 21, 2012.

Office Action for U.S. Appl. No. 13/777,267, dated Jan. 15, 2014.

Smith, S.T., Ultraprecision Mechanism Design, Chap. 4, "Flexure Design for Positioning and Control", pp. 95-112.

Vehar, Christine, "Flexure Design for Precision and Control", http://www.engin.umich.edu/labs/csdl/ppslides/FlexureDesignForPrecisionAndControl_files/v3_document.html (Mar. 18, 2004).

Office Action for U.S. Appl. No. 11/674,315, dated Sep. 19, 2008.

Notice of Allowance for U.S. Appl. No. 12/537,028, dated Apr. 1, 2011.

Office Action for U.S. Appl. No. 11/674,315, dated Apr. 27, 2011.

Ex parte Quayle Communication for U.S. Appl. No. 11/674,315, dated Jul. 21, 2011.

Ex parte Quayle Communication for U.S. Appl. No. 12/505,279, dated Nov. 14, 2011.

Notice of Allowance for U.S. Appl. No. 13/180,922, dated Dec. 30, 2011.

Notice of Allowance for U.S. Appl. No. 12/505,279, dated Feb. 16, 2012.

Notice of Allowance for U.S. Appl. No. 13/324,459, dated May 4, 2012.

Office Action for U.S. Appl. No. 13/208,887, dated Nov. 7, 2012.

Office Action for U.S. Appl. No. 13/211,507, dated Nov. 27, 2012.

Office Action for U.S. Appl. No. 13/560,583, dated May 10, 2013.

Interview Summary for U.S. Appl. No. 13/560,583, dated May 29, 2013.

(56) References Cited

OTHER PUBLICATIONS

Ex parte Quayle Communication for U.S. Appl. No. 13/208,887, dated Jul. 11, 2013.
Office Action for U.S. Appl. No. 13/777,267, dated Sep. 13, 2013.
Office Action for U.S. Appl. No. 13/560,583, dated Oct. 22, 2013.
Office Action for U.S. Appl. No. 13/965,333, dated Dec. 31, 2013.
Office Action dated Sep. 17, 2014 for corresponding U.S. Appl. No. 13/560,510.
Interview Summary for U.S. Appl. No. 13/777,267, dated Apr. 28, 2014.
Advisory Action for U.S. Appl. No. 13/777,267, dated Apr. 2, 2014.
Office Action for U.S. Appl. No. 13/560,583, dated Mar. 19, 2014.

* cited by examiner

QUASI-TRANSLATOR, FOURIER MODULATOR, FOURIER SPECTROMETER, MOTION CONTROL SYSTEM AND METHODS FOR CONTROLLING SAME, AND SIGNAL PROCESSOR CIRCUIT

CROSS-REFERENCE TO RELATED APPLICATION(S)

This application is a continuation non-provisional patent application of U.S. patent application Ser. No. 13/682,857, filed on Nov. 21, 2012, which is a continuation non-provisional patent application of U.S. patent application Ser. No. 13/682,801, filed on Nov. 21, 2012, and claims the benefit of the filing date of, and priority to, U.S. Provisional Application No. 61/563,109, filed Nov. 23, 2011, the entirety of which applications are incorporated herein by reference.

FIELD OF THE INVENTION

The present invention is in the field of mechanisms for economically producing pure, smooth translational motion, preferably with a broad arc, and substantially error-free motion regardless of orientation and for motion control systems and methods of use thereof. Such substantially smooth translational motion is critical for precision instrumentation applications. One such application is the movement of optical assemblies, such as retroreflectors, mirrors, reflecting panels, etc., in interferometer/spectroscopy applications.

BACKGROUND OF THE INVENTION

Fourier transform infrared ("FTIR") spectrometers are well known in the art. Michelson interferometers function by splitting a beam of electromagnetic radiation into two separate beams via a beam splitter. Each beam travels along its own path, e.g., a reference path of fixed length and a measurement path of variable length. A reflecting element, such as a retroreflector, is placed in the path of each beam and returns both beams to the beam splitter. The beams are there recombined into a single exit beam. The variable path length causes the combined exit beam to be amplitude modulated due to interference between the fixed and variable length beams. By analyzing the exit beam, the spectrum or intensity of the input radiation may, after suitable calibration, be derived as a function of frequency.

When the above interferometer is employed in an FTIR spectrometer, the exit beam is focused upon a detector. If a sample is placed such that the modulated beam passes through it prior to impinging upon the detector, the analysis performed can determine the absorption spectrum of the sample. The sample may also be placed otherwise in the arrangement to obtain other characteristics.

Where the path length through the interferometer is varied by moving a retroreflecting element along the axis of the beam, the maximum resolution attainable with the instrument is proportional to the maximum path difference that can be produced. Because Michelson interferometers rely upon the interference from recombination of the two beams, a quality factor of such a device is the degree to which the optical elements remain aligned during path-length variation. A moving mirror is an important part of any Michelson interferometer, and the smoothness of its motion is an important part of maintaining the accuracy and stability of the spectrometer. Thus, translational displacement of the mirror must be extremely accurate. That is, the mirror must in most cases remain aligned to within a small fraction of the wavelength of incident light, over several centimeters of translation. Any deviation from pure translation may cause slight tilting of a plane mirror, leading to distortion in the detected beam. Substitution of cube-corner and cats-eye retroreflectors for plane mirrors may essentially eliminate such tilting distortion problems; but with certain inherent drawbacks.

Precision bearings may be used to maintain alignment. In addition, monitoring and controlling alignment with analysis of feedback and subsequent repositioning has been utilized to maintain mirror alignment. Typically, systems relying on either such solution have been difficult to design, relatively large, expensive and present maintenance issues.

Other efforts have been made to develop interferometers that do not require precision bearings or control systems. See, for example, U.S. Pat. No. 4,915,502 to Brierley, issued on Apr. 10, 1990, and U.S. Pat. No. 4,383,762 to Burkert, issued on May 17, 1983. However, such devices include structural deficiencies that do not provide pure, smooth translational motion, preferably with a broad arc, and substantially error-free motion regardless of orientation thereof. For example, the rigid pendulum design of the Burkert device is inherently unbalanced (which leads to various problems, such as, but not limited to, the velocity of the pendulum not being compensated, the pivot point becomes stressed, etc.), and would not operate in any orientation. While the Brierley device would also not operate in any orientation given the design thereof, further deficiencies of the complex design of the Brierley device requires an inordinate number of components, and unnecessary movement of those components, that add to economic cost and inefficiencies relating to manufacturing and maintaining same. Additionally, such devices require complex re-calibration when switching those devices from one system to another, and such complex re-calibration can include an inordinate number of steps to perform same.

So-called "porch swing" mounting arrangements are also known in the art. However, the extremely high machining tolerances required of such an arrangement and related issue of assembling same, result in high costs of both manufacture and maintenance. In addition, such pure translation flexure mounts are not typically useful for the relatively large displacements necessary for high resolution applications. The need for greater displacement can be achieved, but primarily through great cost of highly engineered precision instrumentation.

Over and above the issues raised above, the mirror-supporting structure must be isolated to the greatest possible degree from extraneous forces which would tend to produce distortions of the structure. Such forces, jerkiness, velocity variations and resultant distortions introduce inaccuracies into the optical measurements and into the motion of the optics, such as a retroreflector. The forces may arise from vibrational effects from the environment and can be rotational or translational in nature. A similarly pervasive issue concerns thermal and mechanical forces. Needless to say, considerations of weight, size, facility of use, efficiency, manufacturing cost and feasibility are also of primary importance.

Examples of external stresses that can affect the optical flatness of a reflective panel, an optical filter and/or the perpendicularity of reflective surfaces of abutting reflective panels of a hollow retroreflector, are thermal expansion or contraction of the substrate material from which the panels are made, deflection caused by curing of the adhesives used to join elements together and/or to join the retroreflector to its mount and/or the mass of the panels themselves. Accordingly, it would be desirable to assemble together the elements of a hollow retroreflector or of an optical filter, and/or to assemble a reflective panel to a device, such as a mount, quasi-translator, actuator moving mechanism, etc., in such a manner as to reduce these stresses. It would also be desirable that the manner of mounting an optical filter, reflective panel(s) and/or a retroreflector to its device not add to these stresses, but nevertheless, securely retain the optical filter, reflective panel(s) and/or retroreflector on the device. Some examples of hollow retroreflector mounts which have proven successful in maintaining the reflective surfaces in their particular orientations are found in U.S. Pat. No. 3,977,765, to Morton S. Lipkins, U.S. Pat. No. 5,122,901, to Zvi Bleier, and U.S. Pat. No. 5,335,111, also to Bleier.

There are needs to provide small front-to-back distance for compactness and to have the actuator (also referred to as the "moving mirror mechanism" or "quasi-translator") that moves the optical device, e.g., mirror, retroreflector, etc., work in any orientation. Indeed, providing such flexibility in a compact environment is preferable.

Additionally, a problem occurs when attempting to process and control one or more light/radiation source signals of such optical assemblies. For example, in one or more embodiments, it is important that a processor produce a three (3) microsecond pulse from both zero crossings of the signal. It is not simple to do this. One way to do this involves processing a direct current ("DC") signal with comparators with adjustable thresholds. However, the problem with this method is sensitivity to pedestal shifts. Another way to do this involves an alternating current ("AC") signal and comparators set to zero. Unfortunately, the problem with this method is random injection of DC during turn around. Such arrangements can result in zero velocity occurrences, which can result in various problems, such as, but not limited to, instability at thresholds, manifestations of incorrect/extra sample pulses that negatively affect the motion control and data collection of the optical assemblies, etc.

Accordingly, it would be desirable to provide a quasi-translator/actuator/mirror moving mechanism for use in at least one optical assembly to achieve error-free, smooth and pure translation over a sufficiently large displacement at a reasonable cost of manufacture and maintenance. It is also desirable that: (i) the quasi-translator and/or the optical assembly be isolated from extraneous forces tending to produce optical distortions, which affect the optical movement; (ii) the quasi-translator and/or the optical assembly be compact; and (iii) the quasi-translator and/or the optical assembly works in any orientation. It would be further desirable to provide a motion control system for such quasi-translators and/or optical assemblies, to avoid the aforementioned problems, including, but not limited to, zero velocity occurrences.

SUMMARY OF THE INVENTION

Accordingly, it is a broad object of the invention to provide an actuator or quasi-translator that operates as a moving mirror mechanism, comprising: a support; an arm having a first end and a second end and including a driving element, such as a magnet, on the first end and a driven element on the second end; an axis, fixed in the support, perpendicular to the arm, acting as an axis of rotation of the arm; a bearing system fixed to the support, disposed along the axis, constraining the arm to rotate about the axis in a plane perpendicular to the axis; a drive coil substantially in the plane of rotation and fixed to the support; and a drive amplifier, connected across the drive coil, acting as a voltage source to drive the arm in a small or broad arc approximating a translation.

In at least one embodiment, an actuator or quasi-translator includes: a support; an arm having a first end and a second end and including a driven element disposed on and/or connected to the second end; a driving element; an axis, disposed in or on the support, substantially transverse, substantially perpendicular or perpendicular to the arm, that operates as an axis of rotation of the arm; a bearing system fixed to the support, disposed on or along the axis, that operates to constrain or permit the arm to rotate about the axis in a plane substantially transverse, substantially perpendicular or perpendicular to the axis; a drive coil disposed substantially in, in or adjacent to the plane of rotation, the drive coil operating to interact with the driving element and create the translational motion that moves the arm; and a drive amplifier, connected to the drive coil, acting as a voltage source to drive the arm in an arc of a predetermined size and/or shape approximating a translation in one or more predetermined directions.

The quasi-translator may include at least one of the following elements where: (i) the quasi-translator operates to produce at least one of at least a substantially pure, smooth translational motion with the predetermined arc regardless of orientation of the quasi-translator; and substantially error-free or error-free motion regardless of orientation of the quasi-translator; (ii) the quasi-translator operates to substantially reduce or eliminate one or more stresses/forces from affecting the translation and/or movement of the driven element, thereby achieving a design that operates in substantially any or any orientation and is at least one of compact, balanced and inertially compensated; (iii) the quasi-translator includes one or more bent or angled components to achieve the compact, balanced, and inertially compensated design of the quasi-translator; (iv) the compact, balanced, and inertially compensated quasi-translator is achieved by arranging the arm or a portion of the arm on an angle with respect to the driven element such that the arm or the portion of the arm is tilted in relation to the driven element, thereby reducing, minimizing and/or eliminating a sideways motion or displacement of the driven element and/or a beam contacting the driven element, and/or thereby reducing a number of steps and resources directed towards calibration or re-calibration of the quasi-translator when the quasi-translator is moved from one orientation or system to another orientation or system; (v) the driven element is substantially in line, or is in line, with the axis of rotation or a pivot point of the quasi-translator such that the arm that is connected to the driven element and the support of the quasi-translator extends through the axis of rotation or the pivot point of the quasi-translator and the arm is balanced around the pivot point; (vi) a path of the arc is substantially symmetrical or is symmetrical across at least one of: the line defined between the driven element and the axis of rotation or the pivot point of the quasi-translator; and the arm being balanced around the pivot point; (vii) a center of gravity of the driven element and a center of gravity of at least one of the driving element and the driving coil are not in line with the pivot point of the quasi-translator such that the line defined between the driven element and the at least one of the driving element and the driving coil does not extend through the pivot point or the axis of rotation of the quasi-translator such that the sideways motion or the displacement of the driven element and/or a beam contacting the driven element that would otherwise occur is reduced, minimized and/or eliminated; and (viii) the predetermined arc is at least one of a small arc and a broad arc. Additionally or alternatively, the quasi-translator may include at least one of the following features where: (i) one or more linear accelerations in one or more of three axes of the quasi-translator do not result in one or more impulses to the moving elements or components of the quasi-translator; (ii) one or more linear accelerations in all of the three axes of the quasi-translator do not result in one or more impulses to the moving elements or components of the quasi-translator; (iii) one or more rotational accelerations in one or more axes are resisted or substantially resisted by the quasi-translator; (iv) one or more rotational accelerations in two or more axes are resisted or substantially resisted by the quasi-translator; and (v) when rotation accelerations in the two axes are substantially resisted or resisted, only rotational accelerations in the axis of the pivot point produce one or more impulses to the driven element of the quasi-translator. The quasi-translator may include at least one of the following features: (i) the center of mass of the arm is accurately centered on the rotation axis in or substantially in the plane of rotation; (ii) the center of mass of the arm is accurately located substantially in or in a plane midway between the radial bearings; and (iii) the bearings are connected to the support by at least one of bonding, fusing, adhering, screwing, molding and clamping. The quasi-translator may have at least one of the following features: (i) the arc approximating the translation in the one or more predetermined directions incorporates an angle of a predetermined size; (ii) the angle of a predetermined size is formed by a combination of, and consideration of, the center of gravity or mass of, at least: the driven element, the bearing system and the driving element; and (iii) the angle of a predetermined size is formed by a combination of, and consideration of, the center of gravity or mass of, at least the driven element, the bearing system, and the driving element and at least one of: one or more counterweights, a portion of the arm, the arm, the drive coil and a rotor. The quasi-translator may be inertially compensated such that at least one of a swinging, a movement, jerkiness and one or more velocity variations of the arm, a portion of the arm or any other component of the quasi-translator is substantially reduced and/or eliminated in response to at least one of: one or more forces, one or more ambient vibrations, one or more shocks, one or more shocks during movement or shipping of the quasi-translator, and/or one or more shocks during construction of a system including the quasi-translator.

The center of mass or the center of gravity of the arm may be accurately centered on the rotation axis in the plane of rotation. The center of mass or gravity of the arm may be accurately located in a plane midway between the radial bearings. The location of the flexure bearings may be in the middle of the center of mass or gravity such that the quasi-translator may operate in any orientation, e.g., vertical, lateral, etc.

The support may at least one of: (i) be any predetermined size and/or shape for achieving the translation and to properly connect the elements of the quasi-translator together; (ii) be substantially "L" shaped or substantially "C" shaped; (iii) be fixed to a predetermined surface or object such that the support remains stationary; and (iv) operate to fix or orient the quasi-translator to or within a system or optical assembly, the system or optical assembly including at least one of: an interferometer, a modulator, and a spectrometer.

The arm may at least one of: (i) have a freedom of rotation or range of movement around the axis of rotation from a fixed or default position of at least one of: about ±5°; about ±10°; about ±15°; about ±20°; about ±25°; from about 1° to about 5°; from about 1° to about 10°; from about 1° to about 25°; from about 5° to about 10°; from about 5° to about 15°; from about 5° to about 20°; from about 5° to about 25°; from about 1° to about 45°; from about 1° to about 90°; from about 10° to about 90°; and from about 1° to about 180°; (ii) move at least one of: substantially to the left and to the right of the quasi-translator; substantially transverse or substantially perpendicular to the axis of rotation; substantially transverse or substantially perpendicular to the bearing system; around the support in an arc-like path; and substantially within or within a plane of rotation that is substantially transverse, substantially perpendicular or perpendicular to the axis of rotation; (iii) have a center of mass or a center of gravity being accurately centered on the rotation axis in or substantially in the plane of rotation that is substantially transverse, substantially perpendicular or perpendicular to the axis of rotation; (iv) move the driven element around the axis such that the driven element is rotated around the center of gravity or the center of mass of the arm or of the quasi-translator in a balanced, inertially compensated fashion; (v) be connected to at least one of the drive coil, the driving element and the driven element by at least one of: bonding, fusing, adhering, screwing, molding, and clamping; (vi) be connected to the driven element having at least one optical surface at the second end of the arm such that the optical flatness of the at least one optical surface of the driven element is at least one of substantially achieved, achieved, substantially maintained, maintained, substantially optimized, and optimized; (vii) be integral with the driven element such that the optical flatness of the at least one optical surface of the driven element is at least one of substantially achieved, achieved, substantially maintained, maintained, substantially optimized, and optimized; and (viii) lie in or substantially in a plane of rotation such that the plane of rotation extends and substantially passes through both ends of the arm.

The bearing system may include a bearing shaft, and the bearing shaft may at least one of: (i) be disposed such that the bearing shaft is substantially transverse, substantially perpendicular or perpendicular to the arm such that the arrangement of the bearing shaft defines the axis of rotation; (ii) be disposed such that the bearing shaft is substantially transverse, substantially perpendicular or perpendicular to a plane of rotation of the arm such that the arrangement of the bearing shaft defines the axis of rotation, the plane of rotation of the arm extending and substantially passing through both ends of the arm; (iii) be connected to the support by at least one of: bonding, fusing, adhering, screwing, molding, and clamping; (iv) operate to work with one or more bearings of the bearing system such that frictionless, substantially frictionless, substantially smooth, smooth, substantially pure or pure translation of the driven element in a substantially arc-shaped path is achieved, the substantially arc-shaped path being any predetermined size and/or shape; and (v) the one or more bearings may be connected to the bearing shaft by at least one of bonding, fusing, adhering, screwing, molding and clamping. The bearing system may include two identical radial bearings disposed approximately equidistantly on one side and on the other side of the plane of rotation. The bearings of the bearing system may include flexure bearings or flexpivot bearings and/or the flexure bearings or flexpivot bearings may be located substantially in the middle or in the middle of the center of mass or gravity of the quasi-translator such that the quasi-translator operates in any orientation.

The driven element may comprise an optical structure (also referred to as an "optic"), such as, but not limited to, a mirror, retroreflector, optical cube-corner retroreflector, etc. The driven element may include at least one of: an optical structure; a mirror; a reflecting panel; a retroreflector; a hollow retroreflector; and an optical cube-corner retroreflector. One construction for a hollow retroreflector is as disclosed in U.S. Pat. No. 3,663,084 to Morton S. Lipkins.

The drive coil may at least one of: (i) comprise an electromagnetic coil that operates to interact with the driving element such that an electrical signal is converted into the translational motion, thereby moving the driven element along the arc path; (ii) be fixed in place on the support such that the driving element pushes off of, or pulls on, the drive coil to slide against or move along the drive coil, thereby creating the desired motion or translation; (iii) be fixed in place on the support and is connected to the drive amplifier without the use of additional unnecessary components including at least one of: one or more sliding contacts and one or more flexible wire leads; and (iv) interact with the driving element such that when the driving element is fixed on the support and the drive coil moves, the drive coil pushes off of, or pulls on, the driving element to slide against or move along the driving element, thereby creating the desired motion or translation.

When the driving element is fixed on the support and the drive coil moves, the one or more wires or one or more connecting members connecting each element or component of the quasi-translator may be located at one or more movement points of the quasi-translator to avoid the one or more wires or one or more connecting members from being broken or pulled out during operation. The driving element may at least one of: (i) comprise a magnet; (ii) be disposed at or on at least one of an end of a rotor, at the first end of the arm, and at a portion of the arm when the drive coil is fixed to the support; (iii) be fixed to the support when the drive coil is disposed in a location on the quasi-translator such that the drive coil operates to move, thereby creating the desired motion or the translation; (iv) be integral with the rotor or the arm; (v) operate to interact with the drive coil such that the driving element and the drive coil push off of, pull on, slide against or move along each other to create the desired motion or the translation; and (vi) act as a main counterweight to help balance the quasi-translator such that the balance and/or inertial compensation of the quasi-translator is achieved.

The drive amplifier may at least one of: (i) comprise an operational amplifier; (ii) be connected to, disposed on or disposed across the drive coil; (iii) be connected to, disposed on or disposed across a predetermined fixed location of the quasi-translator, or is connected to the quasi-translator and is disposed remotely or proximately to the quasi-translator such that the drive amplifier operates to interact or communicate with the driving element and the drive coil and to control the motion of the driven element; (iv) be disposed on the drive coil while at least one processor is located remotely or proximately to the quasi-translator, the at least one processor operating to control the motion of the driven element or to change a path length of a beam interacting with the driven element at a rate determined by the wavelength of a laser and a crystal; and (v) be a part of, or is connected to, an electrical circuit or a motion control system that operates to control the motion of the driven element.

The quasi-translator may include a relay or coil shorting board that operates to dampen the motion of the drive coil and the driving magnet arrangement. The quasi-translator including the relay or coil shorting board may include at least one of the following features: (i) the relay or coil shorting board operates to damp the drive coil and the drive magnet arrangement when one or more of the electronic components of the quasi-translator or a system including the quasi-translator are de-energized; (ii) energy, which is damped by the relay or the coil shorting board, is dissipated as heat; (iii) the drive coil is shorted by the deactivation of the relay or coil shorting board when the one or more of the electronic components are de-energized, such that the consequent magnetic damping damps any motion of the one or more components of the quasi-translator and prevents damage from moving and/or shipping the quasi-translator or a system including the quasi-translator; (iv) the magnetic damping operates to damp motion of at least one component of the quasi-translator or at least one component of the system including the quasi-translator during the moving and/or shipping of the quasi-translator or the system including the quasi-translator sufficiently such that an ordinary rubber bumper or similar cushion is sufficient to prevent excessively damaging or damaging acceleration or deceleration at the one or more limits of motion or shipping of the quasi-translator or the system including the quasi-translator; (v) the relay or they coil shorting board operates to be disconnected from any processor or power supply for transportation or shipping of the quasi-translator or the system including the quasi-translator or for insertion or removal of the quasi-translator into/from one or more optical assemblies or one or more systems; and (vi) vibrational movement of the driving element induces a voltage and a current in the drive coil such that a force is created on the driving element that operates to oppose the vibrational movement.

In one or more embodiments, the quasi-translator may include at least one of: a hermetic enclosure, the hermetic enclosure operating to at least one of: (i) house the quasi-translator; (ii) keep the quasi-translator stable; and (iii) keep one or more circuits and/or one or more components of the quasi-translator disposed therein away from one or more gases or other types of combustible and/or volatile materials located outside of the hermetic enclosure; and a counterweight comprising tungsten that operates to balance the arm around a pivot point of the quasi-translator.

The quasi-translator may be employed in a Fourier modulator to change the optical path difference of the interferometer/quasi-translator. Indeed, it is an object of the present invention to provide a Fourier modulator comprising a Michelson interferometer, the quasi-translator (e.g., as described above), and control elements, such as electronics, software, etc., permitting the drive amplifier to change the optical path difference of the interferometer/quasi-translator system at a substantially constant rate of change. The Michelson interferometer may be monolithic. A Fourier modulator may include a Michelson interferometer, a quasi-translator as described herein, and one or more control electronics that operate to permit the drive amplifier of the quasi-translator to change an optical path difference of at least one of the Michelson interferometer and the quasi-translator at a substantially constant rate or at a constant rate of change such that the resulting beam path difference slows, hinders or impedes a phase of light or radiation passing through the Michelson interferometer such that a two beam optical interference of the Michelson interferometer is permitted or achieved.

The quasi-translator and/or Fourier modulator may be used in a Fourier spectrometer to create an optical spectrum from a light/radiation beam and/or electrical signal created from the beam. Indeed, it is a further object of the present invention to provide a Fourier spectrometer comprising a Fourier modulator (e.g., as described above), a broadband light source (i.e., a light source that radiates on a broadband wavelength; also referred to as light source/beam, radiation source, radiation beam, radiation/light source, and radiation/light beam) collimated by a first optical system and incident on the Michelson interferometer therein, a second optical system collecting light transmitted by the Michelson interferometer and transmitting it to a sample region, a third optical system collecting light from the sample region and focusing it into a detector region, an optical detector located in the detector region converting the transmitted light from the sample region into an electrical signal, and a Fourier analyzer comprising one or more electronics and software that operate to convert the electrical signal into an optical spectrum. A Fourier spectrometer may include a Fourier modulator as described herein, a broadband light source collimated by a first optical system and incident on the Michelson interferometer therein, a second optical system collecting light transmitted by the Michelson interferometer and transmitting it to a sample region, a third optical system collecting light from the sample region and focusing it into a detector region, an optical detector located in the detector region converting the transmitted light from the sample region into an electrical signal, and a Fourier analyzer comprising one or more electronics and software that operate to convert the electrical signal into an optical spectrum.

In accordance with another aspect of the present invention, a motion control system and method are provided to accurately control the translational movement of the quasi-translator and optic thereon such that substantially error-free, smooth motion may be achieved as described above. The motion control system and/or method may employ a new and improved electrical circuit to control the driving element, such as a magnet, magnet/coil combination, etc., and/or the drive amplifier, such as an operational amplifier, to move the optic, such as by changing the path length at a predetermined rate, rate determined by the motion control system, etc. A motion control system for controlling the motion of a quasi-translator or actuator may include at least one processor connected to the quasi-translator or actuator, the at least one processor operating to at least one of: (i) control a drive amplifier of the quasi-translator or actuator, thereby controlling a driving element and a driven element of the quasi-translator or actuator; and (ii) change a path length of a beam interacting with the driven element at a predetermined rate. The predetermined rate may be determined by a wavelength of a laser and a crystal, a frequency of the crystal or a frequency of an oscillator that is controlled by the crystal, the crystal operating as a reference frequency.

The motion control system may further include a frequency to period converter that operates to at least one of: (i) compare a laser fringe rate to the reference frequency; (ii) determine the time between two successive laser crossings and compare the time to the predetermined rate obtained from the wavelength of the laser and the crystal, the frequency of the crystal or the frequency of oscillator controlled by the crystal; (iii) monitor one or more effects of vibration and/or sound in real time; (iv) determine an amplitude and a location of any disturbance of the one or more effects; and (v) use a seven (7) level prioritized, preemptive interrupt system, wherein at least one level of the interrupt system includes a shadow register set such that interrupt latency is about four hundred (400) nanoseconds at the at least one level.

The drive amplifier may at least one of: (i) comprise an operational amplifier; (ii) be connected to, disposed on or disposed across a drive coil of the quasi-translator or actuator, the drive coil operating to interact with the driving element of the quasi-translator or actuator such that the drive coil and the driving element create translational motion, thereby moving the driven element of the quasi-translator or actuator; (iii) be connected to, disposed on or disposed across a predetermined fixed location of the quasi-translator or actuator, or is connected to the quasi-translator or actuator and is disposed remotely or proximately to the quasi-translator or actuator such that the drive amplifier operates to interact or communicate with the driving element and the drive coil and to control the motion of the driven element; and (iv) be disposed on the drive coil while the at least one processor is located remotely or proximately to the quasi-translator or actuator.

The motion control system may include a control loop that operates to at least one of: (i) maintain or preserve an optical path length that is proportional to or substantially proportional to a voltage applied to the driving element; and (ii) compute and/or apply a linearly changing voltage ("Gross Position voltage") such that an interferogram for an open loop scan is produced. A laser that produces information used to compute one or more velocity and/or position error voltages may be used in the motion control system, the one or more velocity and/or position error voltages being subtracted from the Gross Position voltage. A laser signal processor that operates to obtain the information from the laser and to pass the information to the at least one processor may be used in the control system. The laser and the laser signal processor: (i) may operate within the control loop or (ii) may operate outside of the control loop. When the laser and the laser signal processor operate outside of the control loop, the laser signal is buffered and transmitted to the at least one processor, wherein the at least one processor further operates to: (i) obtain zero path difference information; (ii) compute and subtract the velocity and the position error voltages from the Gross Position voltage; (iii) change the path length at the rate determined by a laser and a crystal, a frequency of the crystal or a frequency of an oscillator that is controlled by the crystal; and (iv) use the computed and/or obtained information to at least one of adjust, start and stop the driving element and the drive coil, thereby achieving the path length change and affecting the translational motion of the driven element. The at least one processor may include a digitizer that operates to measure an amplitude and a pedestal of the laser signal. The at least one processor may include a laser clock edge therein, the laser clock edge operating to receive the laser information from the laser signal processor.

The motion control system may include an enclosure or a hermetic enclosure and a TIAX or TIA processor circuit connected to one or more components of the motion control system and being located outside of the enclosure or the hermetic enclosure, wherein the digitizer further operates to remove an analog information signal between the enclosure or the hermetic enclosure and the TIAX or TIA processor circuit such that little or no sensitive analog information is passed between the enclosure or the hermetic enclosure and the outside TIAX or TIA processor circuit.

A laser detector that operates to center a scan or to scan over a zero path difference by adjusting an offset voltage may be used in or with the control system. The laser detector may be an infrared detector and may have a response of 1/f where f is a frequency of the crystal. The at least one processor may further operate to: (i) compute and subtract the velocity and the position error voltages from the Gross Position voltage; (ii) change the path length at the rate determined by a laser and a crystal, a frequency of the crystal or a frequency of an oscillator that is controlled by the crystal; and (iii) use the computed, scanned and/or obtained information to at least one of adjust, start and stop the driving element and the drive coil, thereby achieving the path length change and affecting the translational motion of the driven element. At least one of the laser detector, the drive amplifier and the laser signal processor may be disposed on a printed circuit board located or mounted within an enclosure or a hermetic enclosure such that only one or more digital signals pass in and out of the enclosure or the hermetic enclosure, thereby reducing susceptibility of the motion control system to at least one of one or more environmental condition(s) from the outside of the enclosure or the hermetic enclosure, force(s), temperature, noise and vibration(s) and thereby permitting derivation of a reliable clock in one or more extreme or outrageous environmental conditions. The enclosure or the hermetic enclosure may include a predetermined location that operates to house a desiccant therein such that the desiccant operates to remove the moisture and maintain one or more environmental conditions within the enclosure or the hermetic enclosure.

One or more principles of loop tuning, sample rate jitter and the bandwidth may be balanced in the motion control system. The motion control system may further include at least one of: (i) a VT100 display that operates to be used for software and/or hardware development, diagnostic(s), field service and production; (ii) an oscilloscope; (iii) a schematic; (iv) a thump detector that operates to quantify and locate one or more bumps to the quasi-translator or actuator in real time; and (v) a watch loop that operates to at least one of: provide a real time window into operation of the motion control system; tune one or more components of the motion control system; display average laser clock jitter or root mean square jitter; and monitor the thump detector in real time. The system may not employ one or more comparators such that one or more zero velocity occurrences or one or more extra laser pulses do not affect the quasi-translator or actuator and/or the motion control system, thereby improving quality of data collection.

A method for controlling a motion control system may include the steps of controlling a drive amplifier of a quasi-translator or actuator to control a driving element and a drive coil of the quasi-translator or actuator such that the driving element and the drive coil operate to interact, thereby creating translational motion and moving a driven element connected to the quasi-translator or actuator; and changing an optical path length of a beam interacting with the driven element of the quasi-translator or actuator at a predetermined rate. As discussed further herein, the method may include using computed and/or scanned information to at least one of adjust, start and stop the driving element and the drive coil such that the path length change is achieved and the translational motion of the driven element is affected. A non-transitory computer-readable storage medium containing software code operating to cause one or more processors to perform the steps of the method for controlling a motion control system is also provided.

In accordance with one or more aspects of the present invention, a signal processor circuit is provided, and may be used with the quasi-translator, Fourier Modulator, Fourier Spectrometer and/or motion control system of the present invention. The signal processor circuit may include: a diode transimpedance amplifier; a potentiometer or a three-terminal resistor with a sliding contact that operates as a voltage divider; and a switched gain amplifier or a drive amplifier, the switched gain amplifier or the drive amplifier being computer-controlled such that the gain and/or speed of the diode transimpedance amplifier remains substantially constant or constant, thereby obtaining smoothness of movement and allowing for, or improving, photometric accuracy, consistency and stability. The potentiometer or the three-terminal resistor may require little or no adjustment in a hermetic enclosure that operates to house the signal processor circuit; the diode transimpedance amplifier may be a photo diode transimpedance amplifier; and/or the consistency and stability may remain constant or substantially constant at different times and/or between one or more systems with which the circuit interacts. The signal processor circuit may not employ one or more comparators such that one or more zero velocity occurrences or one or more laser pulses or one or more extra laser pulses do not affect the quasi-translator and/or the signal processor circuit, thereby improving quality of data collection.

It is the purpose of this invention to produce substantially pure, smooth translational motion with a predetermined arc, such as a small or broad arc, and error-free motion regardless of orientation.

Furthermore, it is a purpose of this invention to provide an inertially compensated design so that forces, such as ambient vibrations, do not cause jerkiness and velocity variations in the motion of the driven optic, such as a retroreflector, mirror, reflecting panel, etc.

Surprisingly it has been found that employing a driving element that moves, such as, but not limited to a magnet, and that acts as a counterweight while an electromagnetic coil remains static to define the drive motor achieves the desired results of providing a small or broad arc and substantially error-free motion regardless of orientation of the device. Because the electromagnetic coil is fixed, this design achieves the desired results without requiring the use of one or more sliding electrical contacts or flexible leads when connecting the electromagnetic coil to a drive power source.

Accordingly, it is an object of the invention to provide a quasi-translator for efficient, smooth and substantially error-free movement of an optical structure.

Another object of the invention is to provide a quasi-translator which causes minimal external stresses to the movement path and/or reflective surfaces of the optical structure. Indeed, it is an object of the invention to provide a quasi-translator for an optical structure wherein the quasi-translator achieves reductions in movement of the optical structure in order to achieve higher-accuracy measurements.

Another object of the invention is to provide a quasi-translator for an optical structure wherein the mounting of the optical structure to the quasi-translator is easy and secure.

Yet a further object of the invention is to provide a Fourier modulator and/or a Fourier spectrometer for use with a quasi-translator in accordance with one or more aspects of the invention.

Yet another object of the invention is to provide a motion control system and method of use thereof to accurately control the translational movement of the quasi-translator and optic thereon such that substantially error-free, smooth motion may be achieved as described above.

Other objects of the invention will in part be understandable and will in part be apparent from the following description.

BRIEF DESCRIPTION OF THE DRAWINGS

For the purposes of illustrating the various aspects of the invention, wherein like numerals indicate like elements, there are shown in the drawings simplified forms that may be employed, it being understood, however, that the invention is not limited by or to the precise arrangements and instrumentalities shown. To assist those of ordinary skill in the relevant art in making and using the subject matter hereof, reference is made to the appended drawings and figures, wherein.

DETAILED DESCRIPTION OF THE PRESENT INVENTION

A quasi-translator/actuator/mirror moving mechanism, a Fourier modulator for use with the quasi-translator, a Fourier spectrometer for use with the quasi-translator, and a motion control system and method of use are disclosed herein. The quasi-translator operates as a moving mirror mechanism, and may have a support; an arm having a first end and a second end and including a driving magnet on the first end and a driven element on the second end; an axis, fixed in the support, transverse (e.g., perpendicular, substantially perpendicular, transverse, etc.) to the arm, acting as an axis of rotation of the arm; a bearing system fixed to or on the support, disposed on or along the axis, that operates to constrain or permit the arm to rotate about the axis substantially in or in a plane transverse (e.g., perpendicular, substantially perpendicular, etc.) to the axis; a drive coil substantially in or in the plane of rotation and fixed to the support; and a drive amplifier, connected to, on or across the drive coil, acting as a voltage source to drive the arm in a small arc approximating a translation. Such structure provides the aforementioned advantages of providing a smooth, pure translation and substantially error-free or error-free movement of the driven element, e.g., an optical structure, such as but not limited to, a retroreflector, a mirror, a reflecting panel, etc., while also substantially reducing and/or eliminating stresses/forces from affecting the translation and/or movement of the driven element, thereby achieving a compact, inertially compensated design that works in substantially any orientation or all orientations.

The actuator/mirror moving mechanism/quasi-translator moves the driven element, such as a retroreflector in one or more predetermined directions (e.g., as defined in relation to the orientation of the axis of rotation L and/or the quasi-translator 12 such that the particular direction of the driving element 5 is substantially perpendicular to and/or substantially transverse to the axis of rotation L and/or the quasi-translator 12, such as, but not limited to, forwards, backwards, up, down, etc.). The quasi-translator may be employed with a Michelson interferometer because a moving optical structure, such as a mirror, retroreflector, etc., is a useful and important part of the Michelson interferometer. For example, the quasi-translator may move a retroreflector being used with a Michelson interferometer forward and back in a broad arc, thereby changing the beampath distance in the interferometer. The resulting beampath difference (e.g., when compared to the other optical arm of the interferometer) slows, hinders, impedes, etc. the phase of a light or radiation beam passing through the interferometer such that the two (2) beam optical interference, which is central to the operation of a Michelson interferometer, is allowed.

Figure 1:
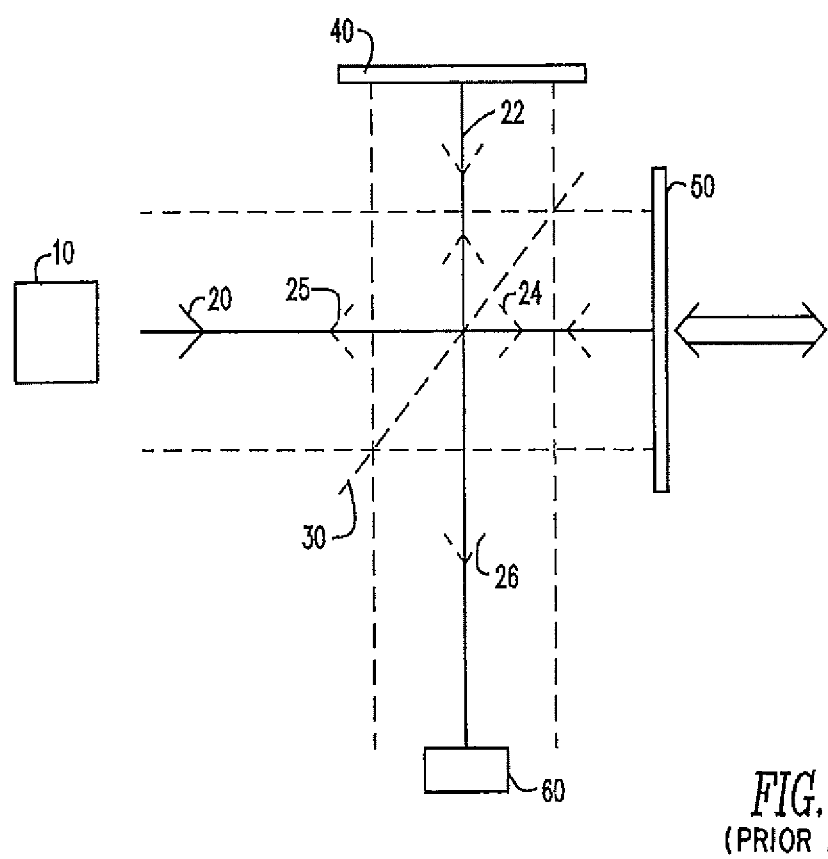
FIG. 1 is a diagram showing how radiation is reflected in a prior art Michelson interferometer.

Turning now to the details of the figures, FIG. 1 shows the general principals of a standard Michelson interferometer. The Michelson interferometer has a radiation source 10 which sends a single radiation beam 20 towards beamsplitter 30 which is situated at an angle to two mirrors, a fixed mirror 40 and a movable mirror 50. Radiation beam 20 is partially reflected toward fixed mirror 40 in the form of radiation beam 22, and is partially transmitted through beamsplitter 30 towards movable mirror 50 as radiation beam 24. Beam 22 is then reflected off of fixed mirror 40, back towards beamsplitter 30, where it is once again partially split, sending some radiation 25 back towards source 10, and some radiation 26 toward detector 60. Similarly, beam 24 reflects off of movable mirror 50 and is reflected back toward beamsplitter 30. Here also, beam 24 is again split, sending some radiation back to source 10 and other radiation 26 toward detector 60.

Detector 60 measures the interference between the two radiation beams emanating from the single radiation source. These beams have, by design, traveled different distances (optical path lengths), which creates a fringe effect which is measurable by detector 60.

Figure 2:
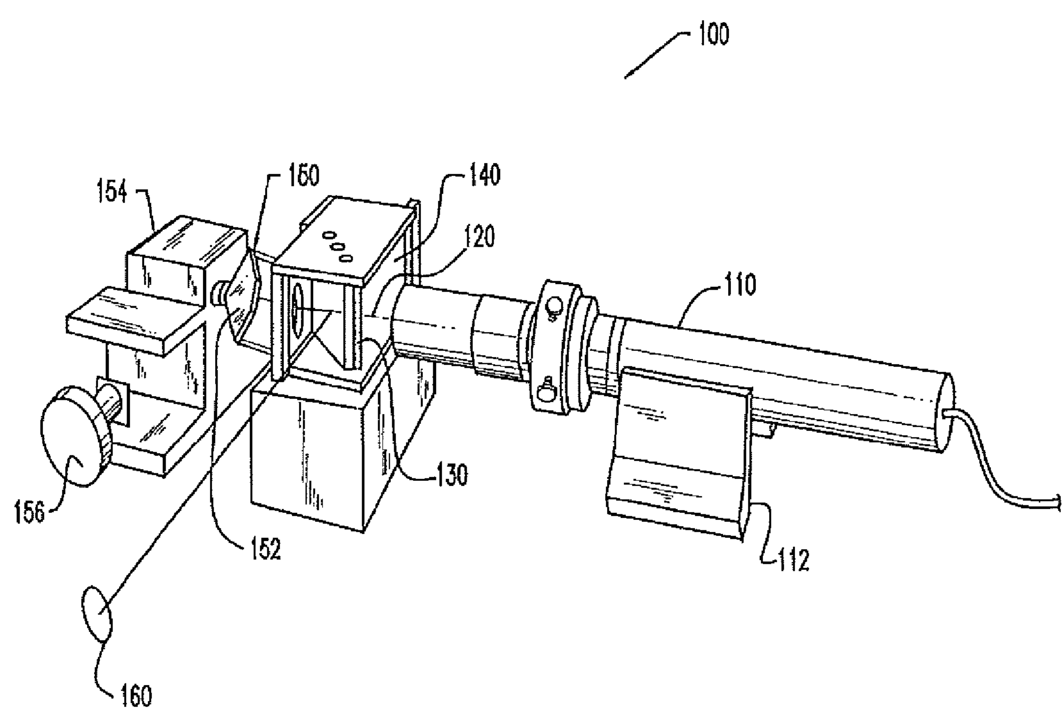
FIG. 2 is a perspective view of an interferometer having a monolithic optical assembly.

FIG. 2 shows the lay out and component structure of a Michelson interferometer of the prior art, e.g., U.S. Pat. No. 6,141,101 to Bleier, herein incorporated by reference. FIG. 2 shows interferometer 100, and includes a radiation source 110, a beamsplitter 130, a movable reflecting assembly 150, a fixed reflecting assembly 140 and a detector 142. Radiation source 110 is mounted in a secure position by mounting assembly 112. With radiation source 110 in mounting assembly 112, radiation beam 120 is alignable along a path which will fix the direction of the beam at the appropriate angle to beamsplitter 130.

Radiation source 110 can be collimated white light for general interferometry applications, such as optical surface profiling, collimated infrared light for an infrared spectrometer, a single collimated radiation intensity laser light source, etc., for accurate distance measurements or any now known, or which become known in the future, light/radiation source used in spectroscopy. Additionally or alternatively, radiation source 110 may be a broadband light source (i.e., a light source that radiates on a broadband wavelength; also referred to herein as (and used interchangeably with) "light", "light source", "radiation", "light source/beam", "radiation source", "radiation beam", "radiation/light source", and "radiation/light beam").

Movable reflecting assembly 150 may utilize a hollow corner-cube retroreflector 152. The hollow corner-cube retroreflector 152 could be made in accordance with the disclosure of U.S. Pat. No. 3,663,084 to Lipkins, herein incorporated by reference.

Retroreflector 152 is mounted to a movable base assembly 144, which assembly allows for adjustment of the location of retroreflector 152 in a line along the path of beam 120. The displacement of assembly 144 is adjustable; e.g., through use of adjusting knob 146. Other means of moving assembly 144 are also anticipated by the invention, including such means that might allow for continuous, uniform movement of assembly 144. For example, means of movement of assembly 144 might be accomplished in accordance with the structure described in U.S. Pat. No. 5,335,111 to Bleier, herein incorporated by reference, or by co-pending application Ser. No. 12/505,279 filed on Jul. 17, 2009.

The use of retroreflector 152 as the movable reflecting assembly 150 allows for any angular orientation of retroreflector 152 as long as edge portions of the retroreflector mirrors do not clip a portion of beam 120.

From the foregoing, the length of the beam paths 20, 22 and 26 are fixed and known while the length of beam path 24 may be varied. The variation of the length of beam path 26 is, of course, critical to the operation of the interferometer, as is knowing the length as precisely as possible.

Figure 3:
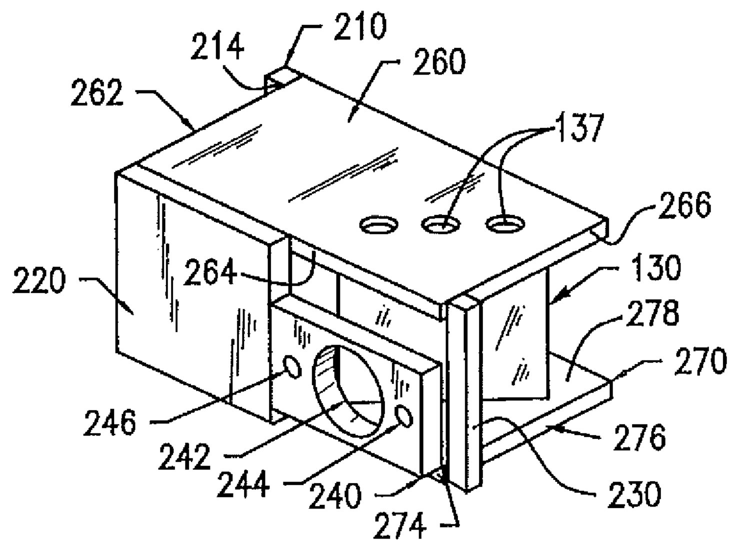
FIG. 3 is a perspective view of a monolithic optical assembly.
Figure 4:
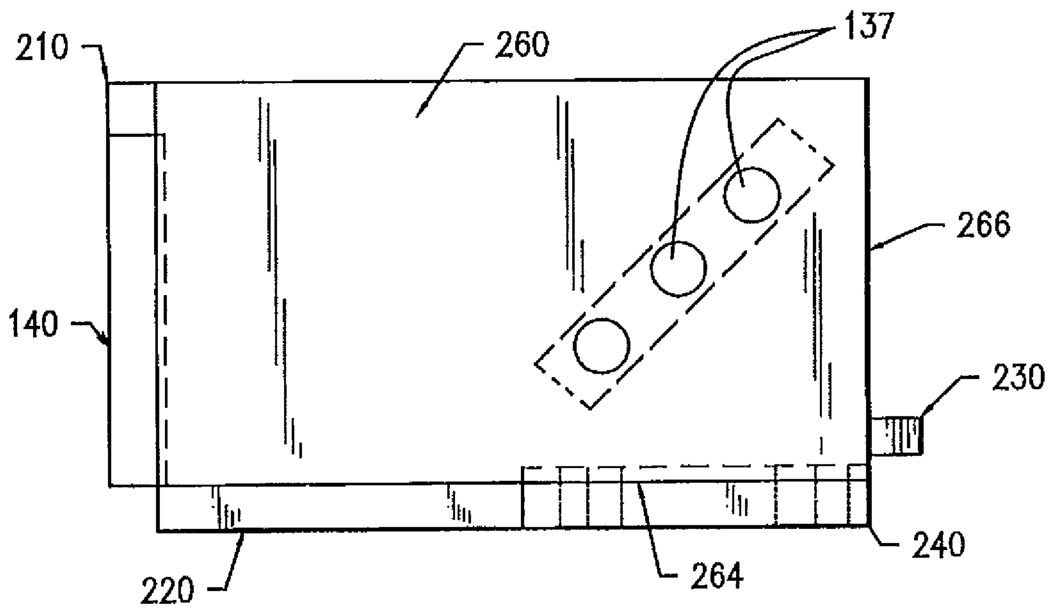
FIG. 4 is an overhead view of a monolithic optical assembly.

A monolithic optical assembly 200, as seen in FIGS. 3-4, comprises a beamsplitter 130 and reflecting assembly 140 mounted within a top plate 260, a bottom plate 270 and at least first and second support members 210 and 220, respectively. As an add-on for some additional structural stability, which stability is not essential, third support member 230 can also be used. Support member 210 has an edge 214. A portion of edge 214 is bonded to a portion of edge 262 of top plate 260, while another portion of edge 214 of support member 210 is bonded to a portion of an edge surface of bottom plate 270.

As shown in FIG. 4, around the corner from support member 210, is second support member 220. Second support member 220 is bonded to top and bottom plates 260 and 270 along different portions of a surface 222 thereof. The portions of surface 222 of support member 220 are bonded to portions of an edge surface 264 of top plate 260 and edge surface 274 of bottom plate 270.

Beamsplitter 130 may be comprised of two panels bonded to each other along a common surface. The common surface is an optically flat reflecting surface having a beamsplitter coating thereon. Beamsplitter 130 is bonded along portions of top edges 137 to portions of bottom surface 267 of top plate 260, and along portions of bottom edges 138 to portions of top surface 278 of bottom plate 270. One panel of beamsplitter 130 is a compensating member. The purpose of the compensating panel is to equate the material portions of the optical path difference of the two beams created by the beamsplitter. Without the compensating panel, the beam transmitted through the beamsplitter would travel through the optical material of the beamsplitter twice, while the reflected beam would travel through optical material zero times. By adding a compensating panel, ideally of the same thickness, wedge, and material as the beamsplitter, both beams travel twice through equal portions of optical material before being recombined at the beamsplitter surface, thereby equating any differences they may have experienced in that portion of their optical path length through material. The invention also anticipates a structure where the compensating panel is separated from the beamsplitter.

The support combination of first support member 210, second support member 220 and beamsplitter 130 between top plate 260 and bottom plate 270 creates a monolithic structure. As earlier discussed, it is also possible to have third support member 230 situated between portions of third edge surfaces 266 and 276 of top and bottom plates 260 and 270, respectively, as seen in the figures.

To complete the required reflecting elements of a Michelson interferometer, it is seen in the figures that a mirror panel 140 is bonded to a portion of top surface 278 of bottom plate 270, and to a second edge surface 214 of support member 210. Mirror panel 140 is slightly over hanging top surface 278 of bottom plate 270 by a portion of a bottom edge surface of mirror panel 140, and is bonded between these touching surfaces. Bonding also takes effect between the side edge surface of mirror panel 140 that touches edge surface 214 of support member 210. Bonding must avoid distorting the optically flat nature of the reflecting surface 142 of mirror panel 140.

Since mirror panel 140 is fixedly attached to assembly 200, as has just been discussed, there is no necessity for panel 140 to be other than a single, flat paneled mirror; for example, panel 140 does not need to be a retroreflector. One of the benefits of using a retroreflector (as has been discussed earlier regarding movable reflecting assembly 150 and as discussed further below) in a structure is that the orientation of the retroreflector is unimportant. The secured mounting of panel 140 to the monolithic structure assures that the orientation of panel 140 will not fluctuate due to vibration and shock, and therefore, a retroreflector is unnecessary (although a retroreflector alternatively could of course be utilized).

The portion of beam 120 that passes through beam splitter 130 and interacts with retroreflector 152 may also be returned via a second mirror panel, similar to mirror panel 140. This second mirror panel may be made integral with second support member 220 or be a separate panel supported by one or all of the second support member 220, edge 264 of top plate 260 and bottom plate 270.

Assembly 200 can also have a fourth support member 240. While the main purpose of fourth support member 240 is not to help stabilize the monolithic structure of assembly 200, it is nevertheless called a support member herein. Instead, fourth support member 240 is positioned in relation to the path traveled by beam 120 so as to allow beam 120 to pass through opening 242 in member 240, to travel between beamsplitter 130 and movable reflecting assembly 150. One or both of elements 244, 246 can comprise reflecting elements for returning beam 120 to retroreflector 252.

All members 210, 220, 230, 240, 260, 270, 130 and 140, of assembly 200, may be made of the same material. The material preferably being fused quartz or annealed Pyrex (e.g., any type of annealed borosilicate glass and/or glasses having a low coefficient of thermal expansion). The use of identical materials allows the coefficients of expansion of the materials to be identical, so that any temperature changes experienced by assembly 200 is experienced equally throughout each member to allow assembly 200 to expand and contract uniformly, thereby substantially removing distortions in the reflecting surfaces of beamsplitter 130 and mirror panel 140.

The monolithic construction discussed above has the benefit of high thermal stability in its optical alignment. This stability derives from the construction of the unit from a single, low expansion material such as Pyrex glass (e.g., any type of annealed borosilicate glass and/or glasses having a low coefficient of thermal expansion), fused silica, Zerodur or Cervit. However, in the application of infrared Fourier transform spectroscopy, often called FTIR, it may not be possible to fabricate the beamsplitter and compensating plate from the same material as the assembly. This may occur when the need for high transmission in the infrared ("IR") is not consistent with available low expansion structural materials. In particular, the high IR transmission optical material may have a much higher thermal expansion coefficient.

Attaching optical elements having a thermal expansion coefficient different from the expansion coefficient of the remainder of the assembly could introduce wavefront distortion in the interfering optical beams or even result in mechanical failure under temperature changes. In order to take advantage of the permanent optical alignment afforded by a monolithic assembly, the connection between optical elements, e.g., beamsplitter and compensating plate, and the rest of the monolithic assembly should transmit minimal stress from this assembly to the optical elements under temperature changes.

Figure 5:
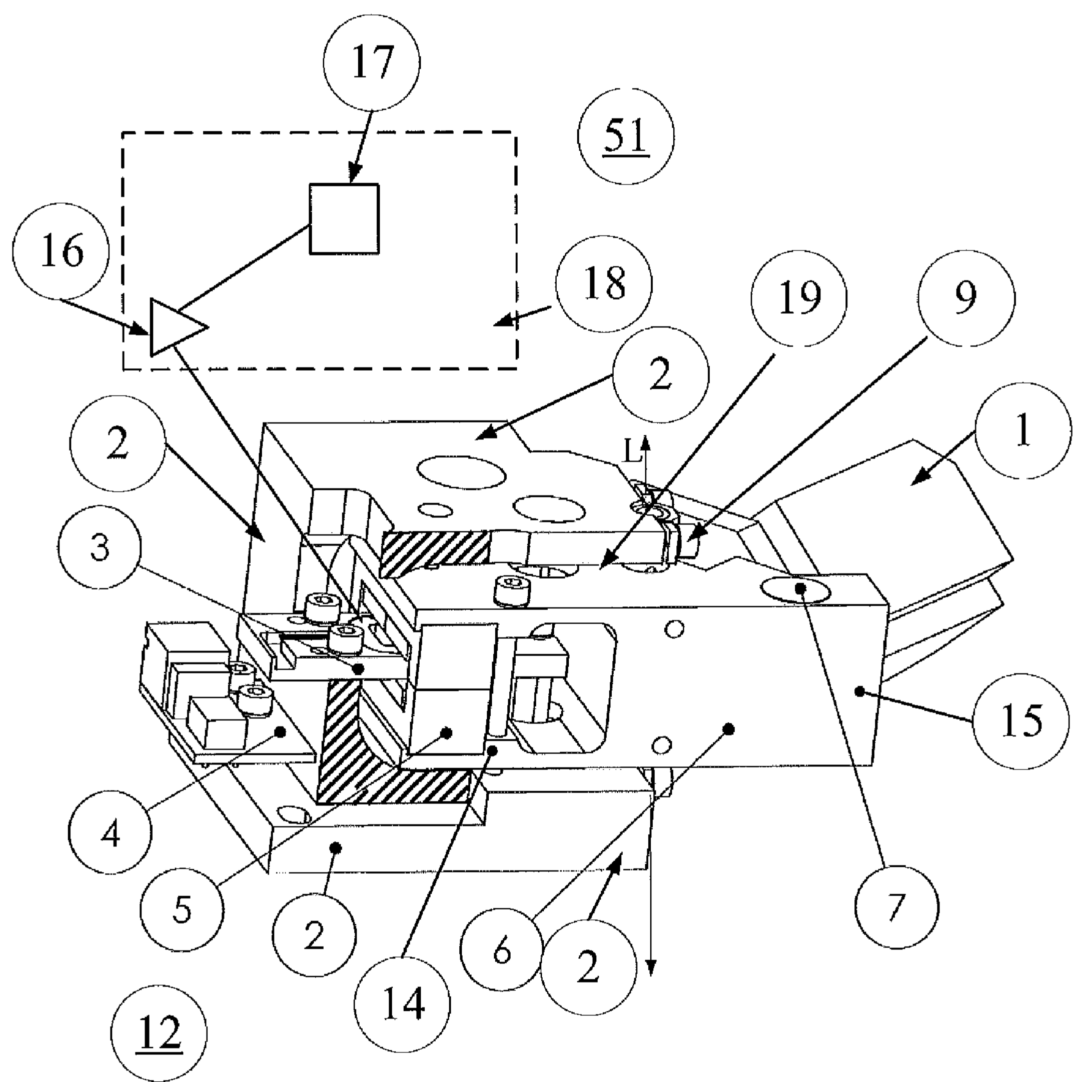
FIG. 5 is a perspective view of the quasi-translator having a retroreflector thereon and having a motion control system drawn schematically in accordance with one or more aspects of the present invention.
Figure 6:
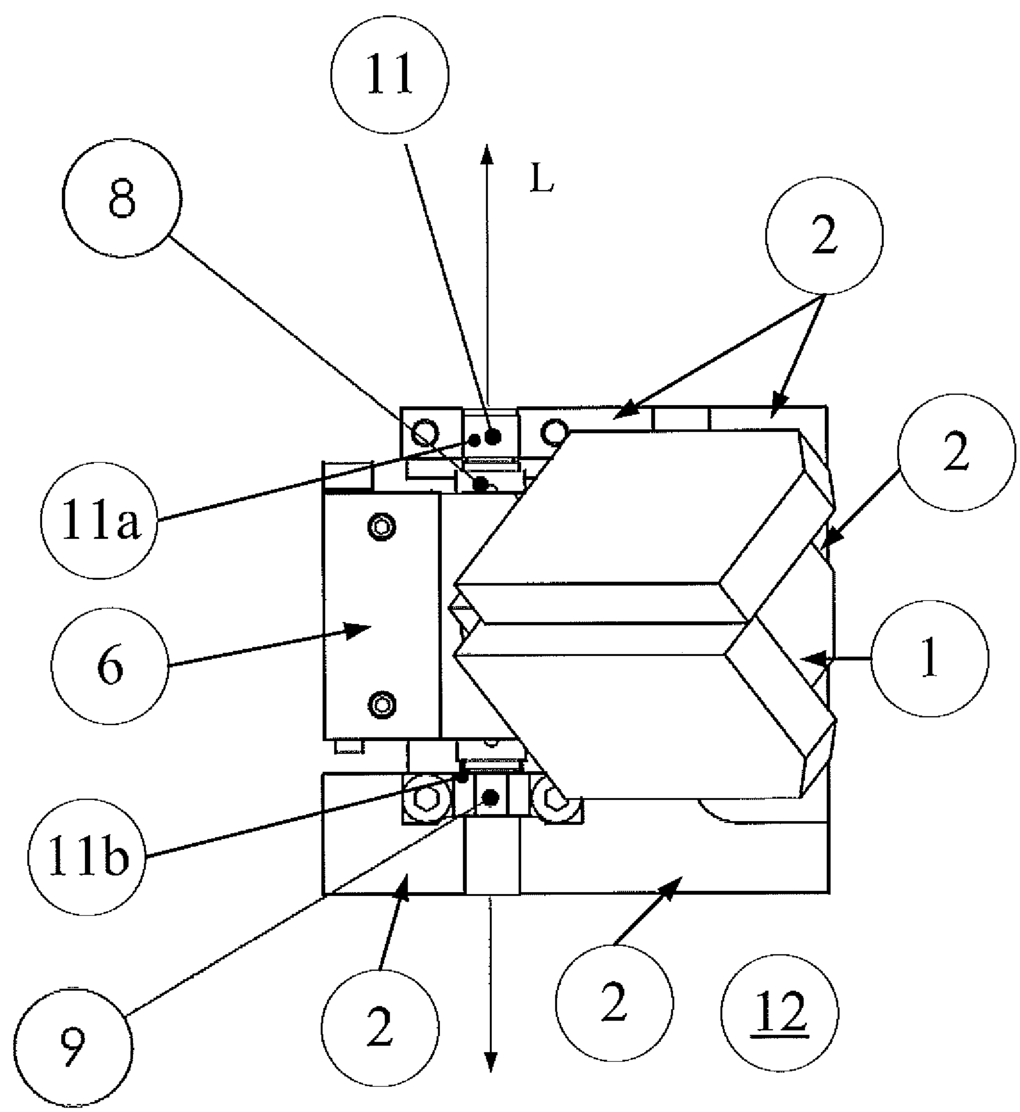
FIG. 6 is a side view of the quasi-translator having a retroreflector thereon in accordance with one or more aspects of the present invention.
Figure 7:
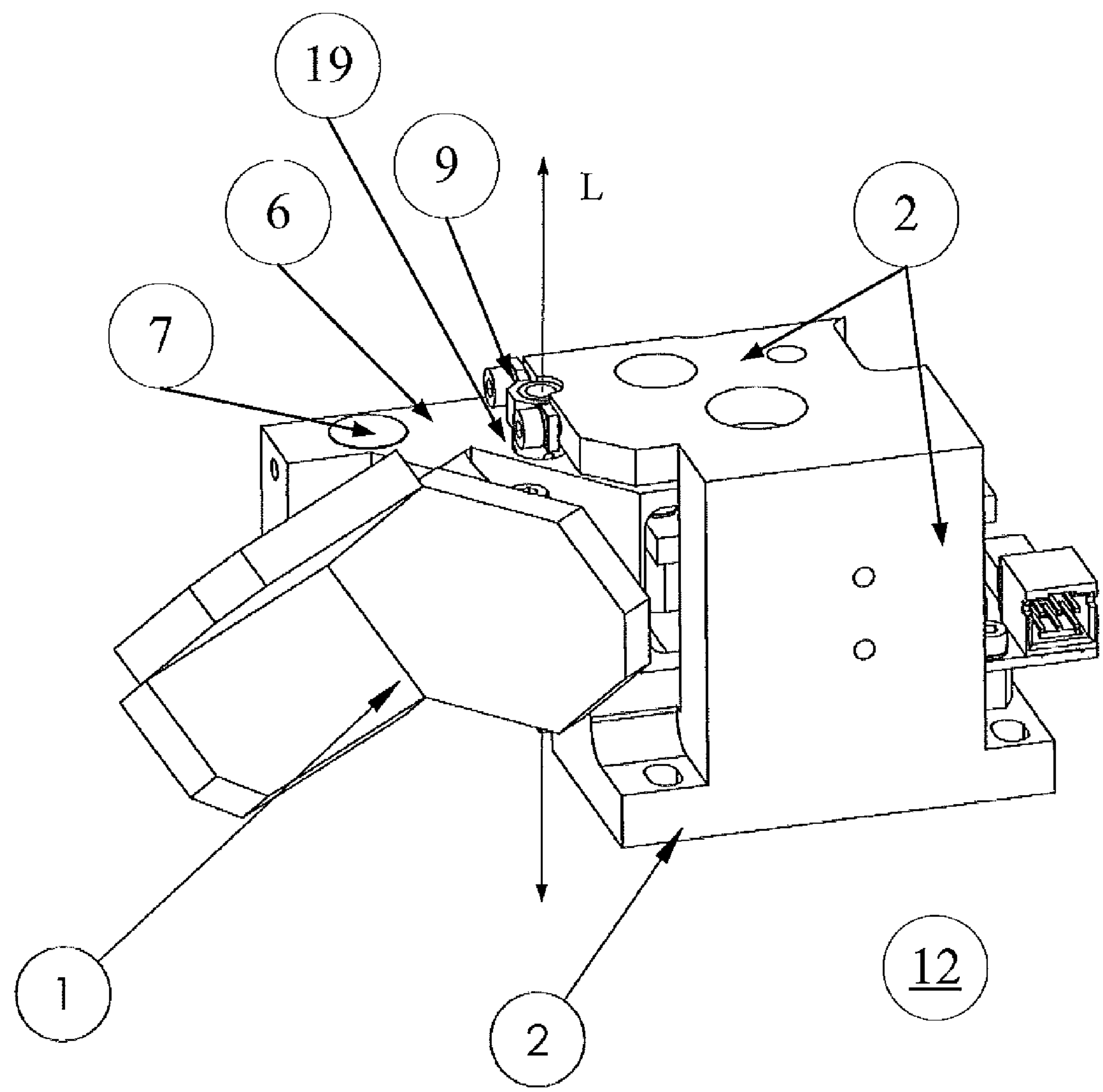
FIG. 7 is a perspective view of the quasi-translator having a retroreflector thereon in accordance with one or more aspects of the present invention.

In accordance with at least one aspect of the present invention, FIGS. 5-7 show a quasi-translator/actuator/moving mirror mechanism. A quasi-translator made in accordance with the invention is generally designated at 12 (best seen in FIGS. 5-7). The quasi-translator 12 that operates as a moving mirror mechanism includes: a support 2; an arm 6 having a first end 14 and a second end 15 and including a driving element 5 on the first end 14 and a driven element, such as retroreflector 1 (best seen in FIG. 7), on the second end 15; an axis, L, (best seen in FIG. 6) disposed on or in the support 2, substantially transverse, substantially perpendicular or perpendicular to the arm 6, such that the axis, L, operates as an axis of rotation of the arm 6; a bearing 11 having a bearing shaft 8, the bearing 11 and bearing shaft 8 being fixed to the support 2 and disposed substantially on, substantially in or substantially along the axis, L, such that the bearing 11 and the bearing shaft 8 operate to constrain or permit the arm 6 to rotate about the axis, L, in a plane substantially transverse, substantially perpendicular or perpendicular to the axis, L; a drive coil 3 disposed substantially on or in the plane of rotation and fixed to the support 2; and a drive amplifier 16 (e.g., such as an operational amplifier 16 as seen in FIG. 5), connected to, on or across the drive coil 3, the drive amplifier 16 operating to act as a voltage source to drive the arm 6 in an arc (e.g., broad or small arc, arc of a predetermined size, etc.) approximating a translation in one or more predetermined directions.

The support 2 may be any predetermined size and shape to achieve the desired functionality and to properly connect the elements of the quasi-translator 12 together. For example, in at least one embodiment, the support 2 may be substantially "L" or substantially "C" shaped (e.g., as shown in FIGS. 5-7). Preferably, the support 2 is fixed to a predetermined surface such that it remains stationary. The support 2 may be used to fix or orient the quasi-translator 12 to/within the overall system or optical assembly, such as, but not limited to, an interferometer, a modulator (as further discussed below), a spectrometer (as further discussed below), etc.

Because the quasi-translator 12 may operate freely without error in any orientation, the arm 6 may move in any predetermined direction. Preferably, the freedom of rotation (i.e., the range of movement around the axis of rotation L from a fixed or default position) of the arm 6 is about ±5° (degrees). In one or more embodiments, the freedom of rotation may be at least one of: about ±10°, about ±15°, about ±20°, about ±25°, from about 1° to about 5°, from about 1° to about 10°, from about 1° to about 25°, from about 5° to about 10°, from about 5° to about 15°, from about 5° to about 20°, from about 5° to about 25°, from about 1° to about 45°, from about 1° to about 90°, and from about 10° to about 90°. Additionally or alternatively, the freedom of rotation may modified to be any value from between about 1° to about 180°. As shown in FIGS. 5-7, the arm 6 may move substantially to the left and to the right of the quasi-translator 12, e.g., substantially transverse or substantially perpendicular to the axis of rotation, L; substantially transverse or substantially perpendicular to the bearing shaft 8; around the support 2 in an arc-like path; substantially within a plane of rotation that is substantially transverse or substantially perpendicular to the axis of rotation, L; etc. (best seen in FIG. 6). The center of mass or the center of gravity of the arm 6 may be accurately centered on the rotation axis, L, in the plane of rotation that is substantially transverse or substantially perpendicular to the axis of rotation, L. The center of mass or gravity of the arm 6 may be accurately located in a plane midway between the radial bearings 11, 11*a*, 11*b* (further discussed below). By moving the retroreflector 1 around the axis, L, the retroreflector 1, therefore, may be rotated around the center of gravity or the center of mass of the arm 6, the quasi-translator 12, etc.; whereas, direct linear movement (e.g., on a carriage) would not be able to achieve such a balanced, inertially compensated result. The first end 14 of the arm 6 may be connected to the driving element 5 by any means known to those skilled in the art, such as, but not limited to, bonding, screwing, molding, clamping, etc. Similarly, the second end 15 of the arm 6 may be connected to the driven element, such as the retroreflector 1, by any means known to those skilled in the art, such as, but not limited to, bonding, screwing, molding, clamping, etc. Preferably, the second end 15 of the arm 6 is connected to the driven element, such as the retroreflector 1, so that the optical flatness of the optical surface(s) of the driven element, such as the retroreflector 1, is achieved, maintained, optimized, etc. Indeed, with regard to high accuracy and precise reflective panels, such as the retroreflector 1, mirror panel, etc., it is important to maintain as substantially optically flat as possible the one or more reflective surfaces of the driven element, such as the retroreflector 1, mirror panel, etc. Preferably, the connection is made via bonding (such as via fusing, adhering, etc.) to avoid distorting the optically flat nature of the driven element, e.g., the retroreflector 1. The driven element, such as the retroreflector 1, may also be made integral with the arm 6 to maintain, achieve, optimize, etc. the optical flatness.

The arrangement of the bearing shaft 8 in the quasi-translator 12 may define the axis, L, running substantially transverse to the arm 6 and/or a plane of rotation of the arm 6, the plane of rotation disposed such that it substantially passes through both sides 14, 15 of the arm 6. Preferably, the bearing shaft 8 is substantially perpendicular or perpendicular to the arm 6 and/or the plane of rotation of the arm 6. The bearing shaft 8 may be connected to the support 2 by any means known to those skilled in the art, such as, but not limited to, bonding, screwing, molding, clamping (e.g., via clamps 9 as shown in FIG. 6), etc.

The bearing(s) 11 of the quasi-translator 12 may include two identical radial bearings 11*a*, 11*b* (bearings 11*a*, 11*b* may be referred to as bearings 11 herein, and "bearings 11" may be used herein to refer to bearings 11*a*, 11*b*, collectively) disposed approximately equidistantly on one side of (e.g., bearing 11*a* is located above) and on the other side of (e.g., bearing 11*b* is located below) the plane of rotation. The bearings 11, 11*a*, 11*b* may comprise flexure bearings or flexpivot bearings. The location of the flexure bearings 11, 11*a*, 11*b* may be in the middle of the center of mass or gravity (e.g., along the axis of rotation L, substantially parallel to the axis of rotation L, co-linear with the bearing shaft 8, etc.) such that the quasi-translator 12 may operate in any orientation, e.g., vertical, lateral, on an inclined angle, etc. The bearings 11, 11*a*, 11*b* work with the bearing shaft 8 to allow frictionless or substantially frictionless (e.g., smooth, pure) translation of the retroreflector 1 in a substantially arc-shaped path. Indeed, the quasi-translator 12 is inertially compensated such that forces, such as ambient vibrations, substantially do not cause jerkiness and velocity variations in the motion of the driven optic, such as a retroreflector 1, mirror, reflecting panel, etc. The arc-shaped path may be any predetermined shape or size. Preferably, the arc is broad (but may be small depending on the use of the quasi-translator 12). The bearings 11, 11*a*, 11*b* may be connected to the support 2 and/or the bearing shaft 8 by any means known to those skilled in the art, such as, but not limited to, bonding, screwing, molding, clamping (e.g., via clamps 9 as shown in FIG. 6), etc.

The driven element may comprise an optical structure (also referred to as an "optic"), such as, but not limited to, a mirror, retroreflector 1 (best seen in FIG. 7), reflecting panel, etc. In the particular embodiment shown in FIGS. 5-7 of this application, the driven element portrayed is an optical structure comprising a hollow retroreflector, which will hereinafter generally be designated in the figures at 1 (best seen in FIG. 7). Those skilled in the art will appreciate and understand how to select, build and attach or integrate a mirror, retroreflector 1, a reflecting panel, etc. For example, one construction for a hollow retroreflector is as disclosed in U.S. Pat. No. 3,663,084 to Morton S. Lipkins.

The drive coil 3 may comprise an electromagnetic coil that operates to interact with the driving element 5 (further discussed below; or may be considered a part of the driving element, such as a magnet 5/drive coil 3 combination described herein) to convert an electrical signal into translational motion, thereby moving the driven element, such as retroreflector 1, along the arc path. Preferably, the drive coil 3 is fixed in place on the support 2 such that the driving element 5 may "push off" or "pull on" the drive coil 3 to slide against or move along the coil 3, thereby creating the desired motion. When the drive coil 3 is fixed, the drive coil 3 may be connected to the drive amplifier 16 (e.g., as discussed further below) without the use of additional unnecessary components, such as, but not limited to, one or more sliding contacts, flexible wire leads, etc. Alternatively, in at least one embodiment, the magnet 5 may be fixed and the drive coil 3 may move to provide the desired translational motion. In such an embodiment, wires or connecting members connecting each element of the quasi-translator 12 may be located at movement points of the quasi-translator 12 (e.g., near the axis of rotation L) to avoid the wires or connecting members from being broken or pulled out during operation.

The driving element 5 may comprise a magnet (e.g., at an end of a quasi-translator rotor (e.g., arm 6; a portion of arm 6 that operates to rotate around the axis of rotation, L; element 19 (such as a rotor that may operate to connect the arm 6 or a portion of the arm 6 to the bearing shaft 8) that is connected to (and/or may be integral with) the arm 6 and that operates to rotate around the axis of rotation, L, as best seen in FIG. 5; etc.)) that operates to move along the drive coil 3 by "pushing off" or "pulling on" the drive coil 3 to create the desired motion in a particular direction (e.g., as defined in relation to the orientation of the axis of rotation L and/or the quasi-translator 12 such that the particular direction of the driving element 5 is substantially perpendicular to and/or substantially transverse to the axis of rotation L and/or the quasi-translator 12, such as, but not limited to, forwards, backwards, up, down, etc.). The moving magnet 5 may act as a main counterweight to help balance the design of the quasi-translator 12 such that the aforementioned balance and/or inertial compensation is achieved. Surprisingly it has been found that employing a driving element 5 that moves, such as the aforementioned magnet, and that acts as a counterweight, while an electromagnetic coil, such as drive coil 3, remains static to define the drive motor, achieves the desired results of providing an arc of a predetermined size and substantially error-free motion regardless of orientation of the quasi-translator 12.

The substantially arc-shaped path of the quasi-translator 12 may incorporate an angle of a predetermined size (e.g., small, large, etc.) for which the driven element, such as the retroreflector 1, may be rotated around the axis of rotation, L. The angle having a predetermined size may be formed by combination of, and consideration of the center of gravity or mass of, at least three elements: the retroreflector 1, the pivot bearing shaft 8, and the driving element, such as the magnet 5. Other elements that may be included for forming the angle include, but are not limited to, additional counterweights, such as counterweight 7 (discussed further below), element 19 (such as a rotor that may operate to connect the arm 6 or a portion of the arm 6 to the bearing shaft 8), a portion of the arm 6, the arm 6, etc. In at least one embodiment, the element 19 (such as a rotor) may be balanced by the driven element, such as the retroreflector 1, and one or more elements of the motor, such as the driving element (e.g., the magnet 5), and the coil 3. Such balance may be maintained and may be achieved by "bending" one or more elements of the quasi-translator 12, such as the arm 6, a portion of the arm 6, etc.

Figure 8:
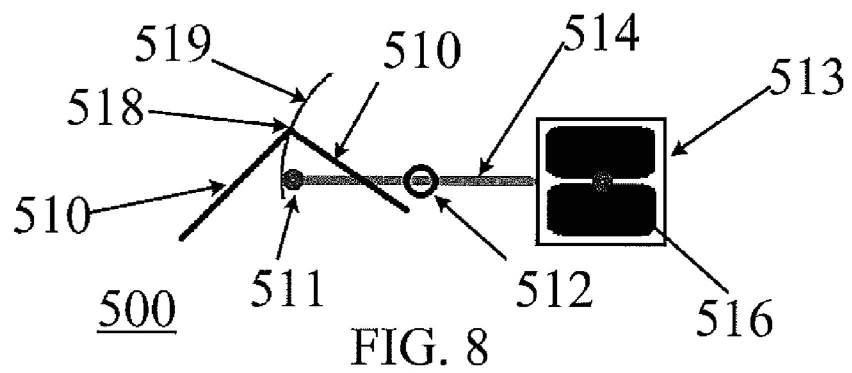
FIG. 8 is a schematic diagram of a balanced quasi-translator in accordance with one or more aspects of the present invention.

Now turning to the details of FIGS. 8-11, schematic diagrams of one or more embodiments of the invention illustrate how the arc-shaped path 519 and substantially error free rotation and balance of the quasi-translator may be achieved in both larger enclosures and compact enclosures. FIG. 8 shows a schematic of a balanced quasi-translator 500 (e.g., from an overhead view) that operates to move a driven element along the arc-shaped path 519. The lines on the left 510 represent a cross-section of the driven element, such as the retroreflector 1. For example, the left line may represent the vertical mirror surface of the retroreflector 1, 510, and the connected line to its right may represent the seam between the two right portions of the retroreflector 1, 510. The spot 511 represents the center of gravity of the retroreflector 1, 510. The circle 512 in the center of the quasi-translator 500 represents the pivot point of the quasi-translator 500, such as around axis of rotation L (e.g., where the bearings 11, 11*a*, 11*b* may be located for the quasi-translator 12). The rightmost structure 513 represents the driving element, such as the moving magnet 5, portion of the motor, and the dot 516 located within the structure 513 represents the center of gravity of the moving magnet structure 513, such as magnet 5. The line 514 represents the moment arm of the rotating structure (which operates similarly to the arm 6 of quasi-translator 12). Because the apex 518 (e.g., where the two black lines of the retroreflector 1, 510 meet) of the driven element 510, such as the retroreflector 1, may move considerably sideways through its useful arc 519 (shown in green), this design may be useful when sufficient space is provided to position the quasi-translator 500 therein. In such a situation, the beam of this arm 6, 514 of the interferometer 1, 510 moves back and forth sideways across the fixed mirror 517 (best seen in FIG. 11) of the arm 6, 514.

Figure 9:
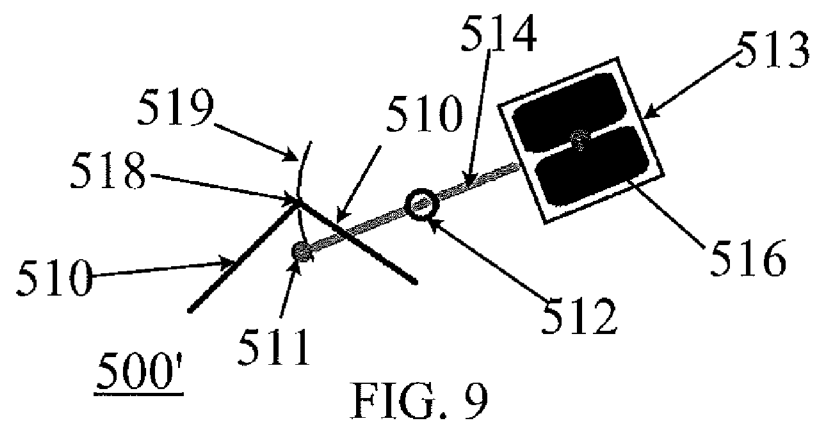
FIG. 9 is a schematic diagram of a balanced quasi-translator in accordance with one or more aspects of the present invention.

Such back-and-forth motion may be minimized or substantially eliminated by tilting the moment arm structure 6, 514 as shown in FIG. 9. This results in minimum sideways back-and-forth motion of the apex of the interferometer 1, 510 and consequently the beam signal. Because the quasi-translator 500 may occupy a lot of space (e.g., vertical space, horizontal space, etc.) when the moment arm structure 6, 514 is not tilted, it may be important to use a smaller hermetic enclosure, and consequently a smaller or more compact quasi-translator 500', to keep the system stable. For example, it may be a plant or industry requirement to use a smaller or compact hermetic enclosure to keep any circuits therein away from any gases or other types of combustible or volatile materials located outside of the enclosure. Additionally, it may just be the case that the commercial use requires a smaller design in general, regardless of the environment. One way to achieve such requirements is to make the hermetic enclosure smaller or more compact. Thus, an alternative embodiment of the present invention is provided using a compact quasi-translator design.

Figure 10:
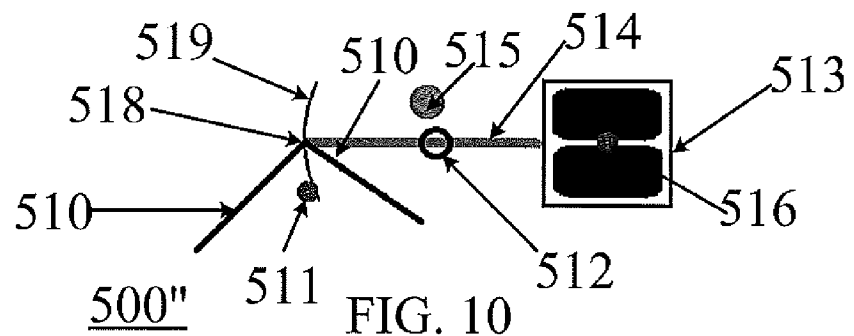
FIG. 10 is a schematic diagram of a balanced quasi-translator having a bent design in accordance with one or more aspects of the present invention.
Figure 11:
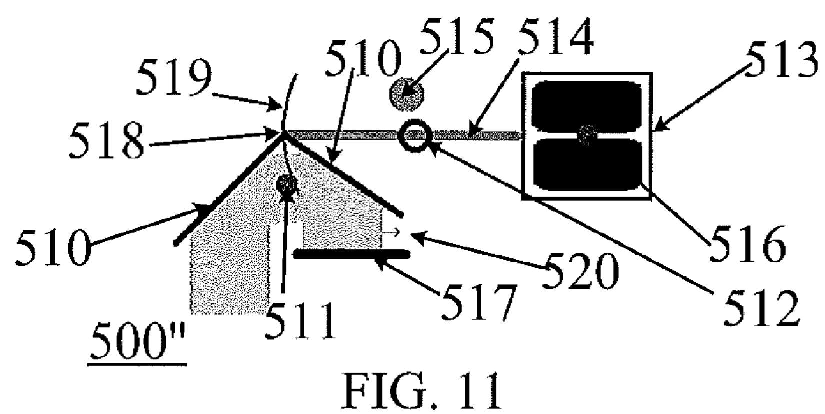
FIG. 11 is a schematic diagram of a balanced quasi-translator having a bent design in accordance with one or more aspects of the present invention.

Both objectives of minimizing back-and-forth motion and providing a compact design are provided for and met by at least one embodiment of the present invention where one or more components of the quasi-translator 500 (or quasi-translator 12, 500', 500" as also discussed herein), such as, but not limited to arm 6, moment arm structure 514, element 19 (such as a rotor), etc., are "bent" (also referred to as being "slightly bent") as shown in FIG. 10. In at least one embodiment, the "bent" design permits the apex point 518 (e.g., where the two black lines of the retroreflector 1, 510 meet) of the retroreflector 1 to be more in line, substantially in line or in line with the bearing 11, 11*a*, 11*b*; axis of rotation L or pivot point 512 of the quasi-translator 12, 500, 500', 500" (as best seen in FIG. 10). Such a bent design is a unique, non-obvious structure that satisfies both objectives of providing the compact design and minimizing or substantially reducing the back-and-forth motion. An additional benefit of the bent design is that the symmetry of the arc path 519 may be preserved (e.g., when the apex point 518 is in line with the axis of rotation L of the quasi-translator 12, 500, 500', 500"). To maintain the balance of the quasi-translator 12, 500, 500', 500" (e.g., around the pivot 512), a counterweight 515 (such as a counterweight 7 or tungsten weight of a predetermined size discussed further below) may be used (shown schematically/diagrammatically as the spot 515 in FIG. 10). Preferably, the counterweight 515 is added to the quasi-translator 12, 500, 500', 500" so that the moment arm 6, 514 is balanced around the pivot 512. The "bending" is illustrated by the fact that the center of gravity 511 of the retroreflector 1, 510 and the center of gravity 516 of the magnet structure 6, 513 are not in line with the pivot 512 (e.g., when a line is drawn between the center of gravity 511 of the retroreflector 1, 510 and the center of gravity 516 of the magnet structure 6, 513). The sideways displacement (represented by arrow 520 in FIG. 11) of the beam on the flat mirror 517 (shown as the bottom black line) of the arm 6, 514 is minimized and/or substantially reduced. The "slightly bent" structure of the quasi-translator 12, 500, 500', 500" provides an inertially-compensated balanced design to be realized in a small space in any orientation (e.g., horizontal, vertical, etc.). Preferably, linear accelerations in one or more of the three axes do not result in impulses to the moving structure. In at least one embodiment, linear accelerations in all three axes do not result in impulses to the moving structure. Preferably, rotational accelerations in one or more axes (e.g., at least two axes in one or more embodiments) are effectively or substantially resisted by the structure of the quasi-translator 12, 500, 500', 500" (e.g., due to the stiffness thereof). When rotational accelerations in two axes are substantially resisted in at least one embodiment, only rotational accelerations in the axis of the pivot produce impulses to the moving structure 510 of the quasi-translator 12, 500, 500', 500". The quasi-translator 500" schematics as shown in FIGS. 10-11 may be used as basic schematics for constructing or referring to elements of the quasi-translator 12. As such, one skilled in the art would understand that the driven element 510 may operate the same as or similar to driven element (e.g., retroreflector 1), the pivot 512 may operate the same as or similar to axis of rotation L, the magnet 513 may operate the same as or similar to magnet 5, the apex 518 of driven element 510 may operate the same as or similar to the apex of retroreflector 1, the arm 514 may operate the same as or similar to the arm 6, the counterweight 515 may operate the same as or similar to the weight 7, the mirror 517 may operate the same as or similar to any fixed mirror being used with retroreflector 1 and disposed in the same or similar fashion, the arc path 519 may be the same as or similar to the arc patch used for quasi-translator 12, and other aspects or elements of quasi-translator 12 and quasi-translator 500" may operate the same as or similar to each other as described herein. Indeed, the schematic of quasi-translator 500" illustrates the compactness concept and substantially error-free movement as similarly provided by the quasi-translator 12. The balanced design of the quasi-translator 12 provides the benefit of greatly reducing steps (e.g., from 150 steps down to 1-4 steps) and resources directed towards re-calibration when switching the quasi-translator 12 from one system to another. Indeed, re-calibration of the quasi-translator 12 does not require an inordinate number of steps.

Moreover, because the quasi-translator 12/actuator is inertially compensated, movement or swinging of the arm 6, a portion of the arm 6, the element 19 (such as a rotor), etc. is substantially reduced and/or eliminated in response to one or more shocks during movement thereof, such as, but not limited to, shipping, setting up a new system arrangement, etc. This provides a unique way to immobilize the components of the quasi-translator 12 during such movement situations. As further discussed below, the quasi-translator 12 may include a coil shorting board 4 that operates to dampen the motion of the coil 3/magnet 5 arrangement. Such a relay or coil shorting board 4 operates to damp the coil 3 and/or magnet 5 when one or more of the electronic components are de-energized. The damped energy may be dissipated as heat. This magnetically damps any motion of the arm 6, a portion of the arm 6, the element 19 (such as a rotor), etc. As such, if any motion does occur during movement of the quasi-translator 12 (e.g., such as during shipping), the motion is damped enough such that damage does not occur to one or more components of the quasi-translator 12, such as the arm 6, a portion of the arm 6, the element 19 (such as a rotor), etc. In at least one embodiment of the invention, element 19 (such as a rotor) of the quasi-translator 12 may be substantially, but not completely, immobilized, but any motion thereof is damped and strong motions are strongly damped, such that an ordinary bumper may be employed to prevent excessive acceleration/deceleration at the limits of motion/travel. For example, the quasi-translator 12 may include magnetic damping that operates to damp motion during movement of the quasi-translator 12 sufficiently such that an ordinary bumper (such as a rubber bumper) or similar cushion is sufficient to prevent excessively damaging or damaging acceleration or deceleration at the limits of motion/travel.

The drive amplifier 16 that operates to act as a voltage source to drive the arm 6 in the substantially arc-shaped path may comprise an operational amplifier (also referred to as an "op amp"), such as op amp 16, as shown in FIG. 5. The drive amplifier or op amp 16 may be part of an electrical circuit 18 (e.g., electrical circuit 18 as best seen in FIG. 5). The electrical circuit 18 may be part of a motion control system 51 that operates to control the motion of the driven element, e.g., retroreflector 1. The electrical circuit 18 and/or the motion control system 51 may further include at least one processor 17 that operates to control the op amp 16, thereby controlling the driving element/magnet 5, the motion of the arm 6 and the driven element, such as retroreflector 1. The op amp 16, the electrical circuit 18 and/or the motion control system 51 may be disposed across the coil 3 or on another fixed portion of the quasi-translator 12. Alternatively, the op amp 16, the electrical circuit 18 and/or the motion control system 51 may be located remotely or proximately to the quasi-translator 12 such that the op amp 16, the electrical circuit 18 and/or the motion control system 51 operates to interact or communicate with the driving element/magnet 5 and the coil 3 and to control the motion of the driven element, e.g., the retroreflector 1, along the substantially arc-shaped path. Additionally or alternatively, the op amp 16 may be disposed on the coil 3 while the at least one processor 17 may be located remotely or proximately to the quasi-translator 12 (e.g., as part of a computer, wireless device, remote portion of the motion control system 51, etc.).

Figure 13:
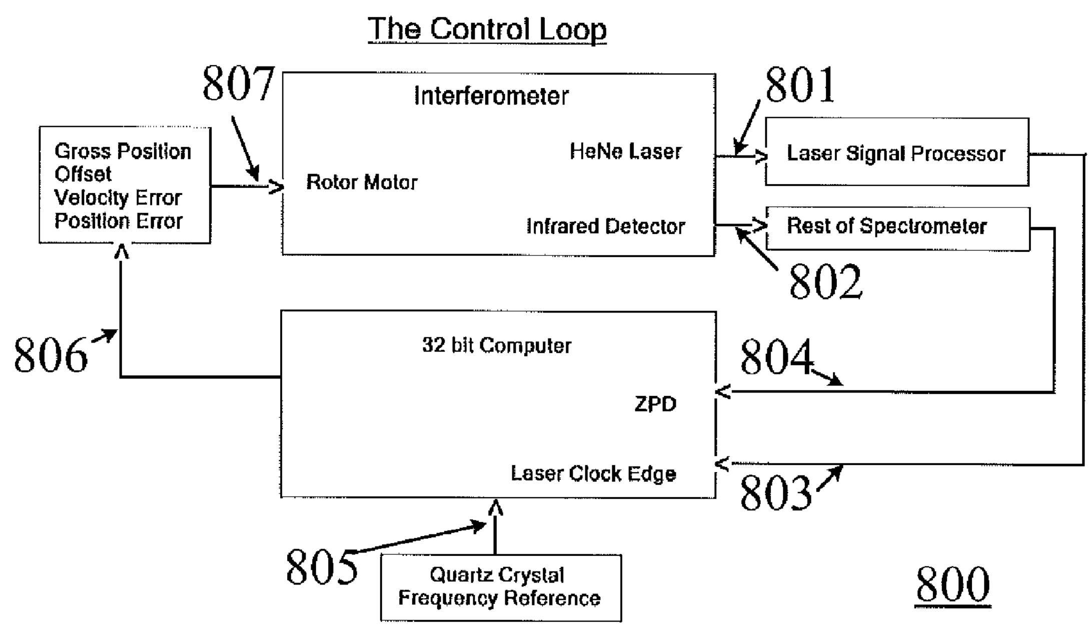
FIG. 13 is a schematic flow diagram of a motion control loop in accordance with one or more aspects of the present invention.

The object of the drive amplifier/op amp 16, the at least one processor 17, the electrical circuit 18 and/or the motion control system 51 is to change the path length at a rate determined by the wavelength of a laser (e.g., a HeNe laser) and a crystal (e.g., a quartz crystal). At the heart of the motion control system 51 may be the at least one processor 17 (which may comprise a 32 bit computer). An example of a motion control system 51 is discussed, as follows:

A control loop 800 for at least one embodiment of the motion control system 51 is provided as shown in FIG. 13. Preferably, the optical path length is nearly proportional to the voltage applied to the driving element, magnet 5, which acts as a motor (also referred to as a "rotor motor") when working with the coil 3 for moving the arm 6, a portion of the arm 6, the element 19 (such as a rotor that may operate to connect the arm 6 or a portion of the arm 6 to the bearing shaft 8), the driven element, such as retroreflector 1, etc. The rotor motor, such as the magnet 5/coil 3 combination, produces a force that may be opposed by flex pivots, such as one or more of the bearings 11, 11*a*, 11*b*. Thus, it may be possible to position the retroreflector 1 (or any other driven element) accurately by applying force to same. Indeed, in at least one embodiment, the position of the driven element may be depend directly on the force applied thereto. It is further possible to use a linearly changing voltage (also referred to as "Gross Position") to produce an interferogram for an open loop scan. The linearly changing voltage may be computed inside the closed loop.

Information from the laser, such as a HeNe laser, is used to compute velocity and position error voltages, which are subtracted from the Gross Position voltage (see e.g., steps 801, 803 and 806 in FIG. 13). For example, a HeNe laser of an interferometer sends information to the laser signal processor (step 801), which then passes the information to a laser clock edge in the processor, such as the at least one processor 17, a computer, a capable 32 bit computer (e.g., a PIC32 computer), etc. (step 803). Information from an infrared detector (e.g., such as detector 142 discussed above) is used to center a scan over a zero path difference ("ZPD") by adjusting the offset voltage (see e.g., steps 802 and 804 in FIG. 13). While any response may be used, the detector may have a 1/f response, where f is frequency. The 32 bit computer may then compute and subtract the velocity and the position error voltages from the Gross Position voltage (step 806). The 32 bit computer may operate to change the path length at a rate determined by the wavelength of the HeNe laser and a quartz crystal (step 805). The 32 bit computer may then use the computed information to adjust/start/stop the rotor motor (step 807), e.g., the magnet 5/coil 3 combination as discussed above, to achieve the desired path length change. Indeed, in one or more embodiments of the motion control system, the PIC32 computer may be substantially involved in handling the calculations to change the path length. In one or more embodiments of the present invention, the control loop may begin its process at any step discussed above or as otherwise shown in FIG. 13; hence, the process is a "loop".

Figure 12A:
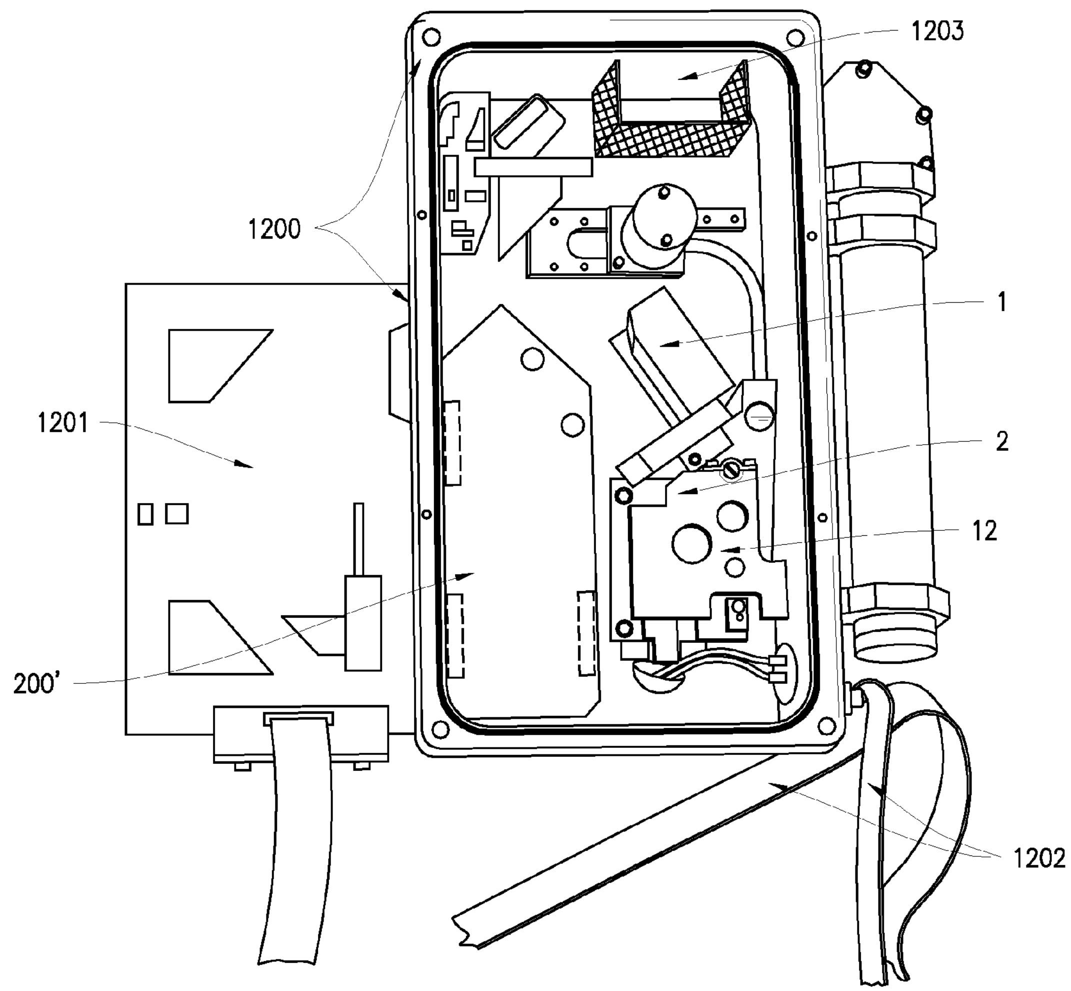
FIG. 12A is an overhead view of a quasi-translator and interferometer with a detector and processor circuits located out of the enclosure in accordance with one or more aspects of the present invention.
Figure 12B:
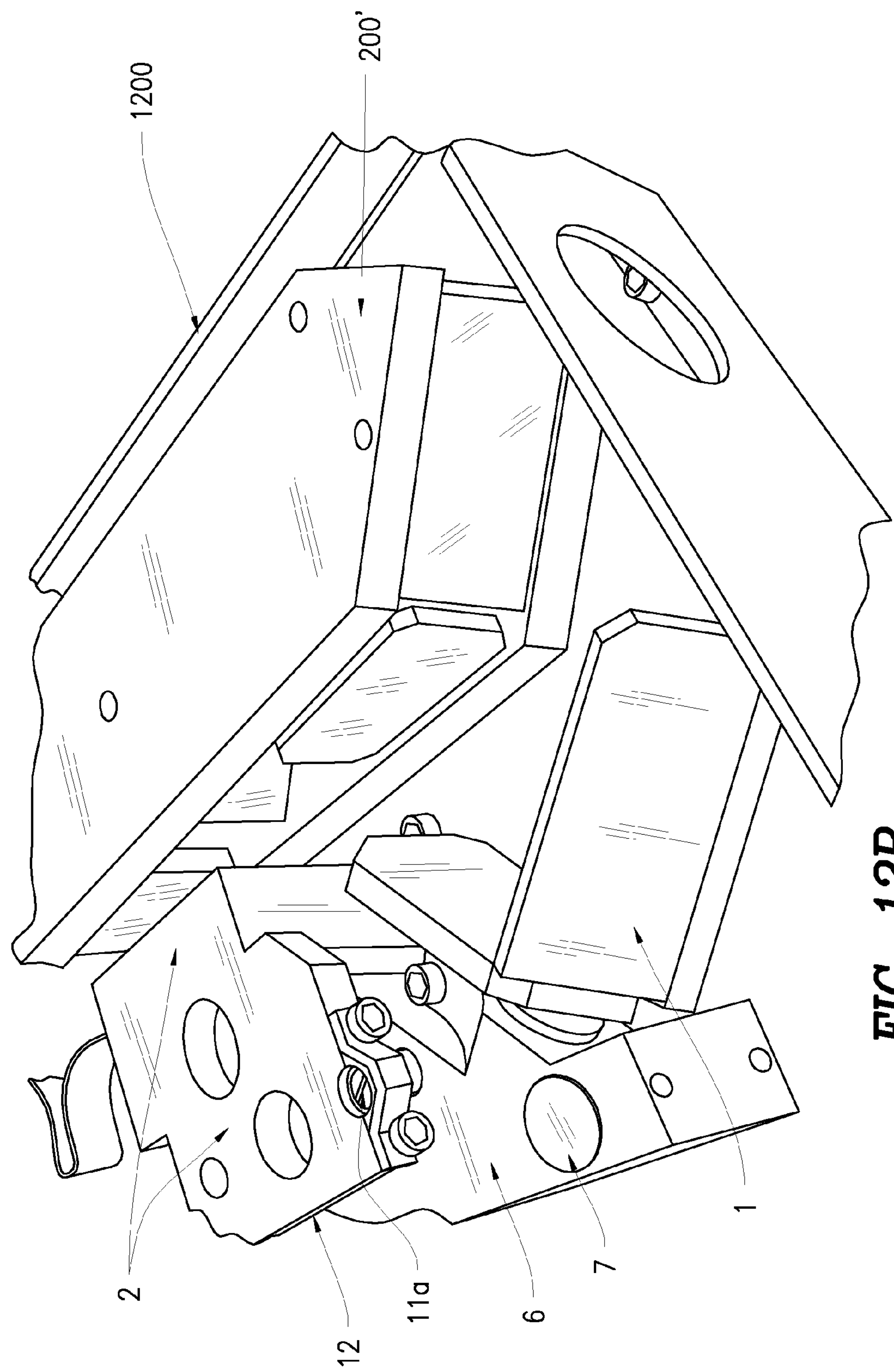
FIG. 12B is a perspective view of a quasi-translator and interferometer in accordance with one or more aspects of the present invention.

One or more of the laser detector (e.g., such as detector 142 discussed above), drive amplifier (e.g., op amp 16) and laser signal processor (best seen in FIG. 13) may be located on a same printed circuit board ("PCB") mounted within a container or enclosure 1200 (such as, but not limited to, a hermetic enclosure 1200 as best seen in FIGS. 12A-12B). In at least one embodiment, the laser detector (e.g., such as detector 142 discussed above), amplifier (e.g., drive amplifier/op amp 16) and laser signal processor (best seen in FIG. 13) are all located on the PCB mounted within the enclosure or container 1200 (e.g., hermetic enclosure 1200 as best seen in FIGS. 12A-12B). This arrangement is also referred to as the TIAX or TIA processor. While the laser detector and the laser signal processor are together on the same PCB, only digital signals pass in and out of the hermetic enclosure, such as the enclosure 1200, which may be hermetic. Such an arrangement greatly reduces susceptibility to noise. While the TIAX/TIA processor may be located outside of the hermetic enclosure (such as enclosure 1200; best seen in FIG. 12A), it is preferred that the processor is located in the hermetic enclosure 1200 to protect the processor for any harsh environmental factors, such as temperature, vibrations, noise, etc. Such an arrangement provides a unique ability to derive a reliable clock in outrageous circumstances (e.g., when the hermetic enclosure 1200 is surrounded by toxic gases, fire, etc.). Preferably, the TIAX or TIA processor is located near the detector and/or optics within the hermetic enclosure. The detector, such as detector 1201 as shown in FIG. 12A, may be located outside of the hermetic enclosure 1200 as well. The hermetic enclosure 1200 may include a predetermined location 1203 (see FIG. 12A) for placing desiccant therein so that the desiccant helps to remove the moisture and maintain environmental conditions within the hermetic enclosure 1200.

However, there is an exception regarding at least one alternate embodiment. For example, a version of the laser signal may be buffered and brought to the PIC 32 such that the laser signal is not part of the control loop. The PIC 32 may include a digitizer, such as a 10 bit digitizer, that operates to measure the amplitude and pedestal of the laser signal. Such an arrangement is part of an automatic gain system and may act as a self-diagnostic. While this at least one alternate embodiment may have to deal with noise of the laser signal, the noise has little to no effect on the PCI32 measurement, and, therefore, does not compromise the PIC32 measurement significantly or at all. In at least one embodiment, the digitizer operates to remove an analog information signal between the hermetic enclosure and the TIAX or TIA processor circuit located outside of the hermetic enclosure such that little or no sensitive analog information is passed between the hermetic enclosure and the outside TIAX or TIA processor circuit. The TIAX or TIA processor may be connected to one or more components of system, including, but not limited to, the digitizer, detector, quasi-translator 12, etc., via one or more connections (such as connections 1202 as shown in FIG. 12A) known to those skilled in the art, such as, but not limited to, an Ethernet cable/link, a USB cable, RS 232, etc.

Figure 14A:
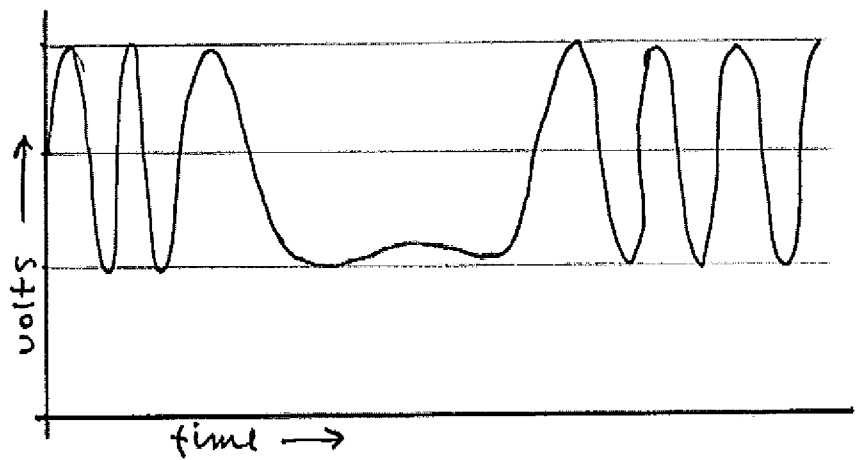
FIG. 14A is a graph of a scan depicting a zero velocity when the laser of at least one embodiment of the present invention was substantially most negative in accordance with one or more aspects of the present invention.
Figure 14B:
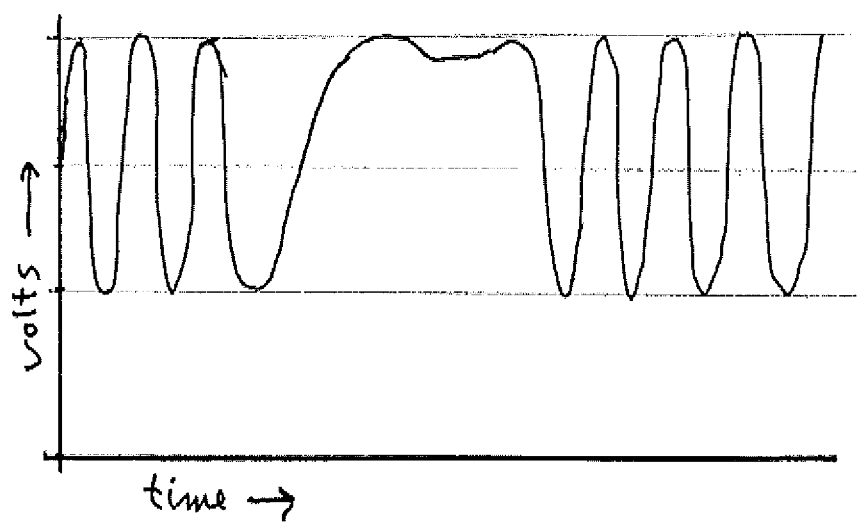
FIG. 14B is a graph of a scan depicting a zero velocity when the laser of at least one embodiment of the present invention was substantially most positive in accordance with one or more aspects of the present invention.

As previously discussed, the TIAX laser signal processor preferably produces a three (3) microsecond pulse from both zero crossings of the laser signal, and this is not simple to achieve. While DC or AC laser signals (with comparators set to zero for the AC laser signal) may be used, both signals present problems, i.e., sensitivity to pedestal shifts and random injection of DC during turn around, respectively. FIGS. 9A and 9B illustrate the problem by depicting two separate scans of at least one embodiment of the circuit. Specifically, FIG. 14A shows that a zero velocity occurred when the laser was most negative, and FIG. 14B shows that a zero velocity occurred when the laser was most positive. When employing a coupling capacitor in either situation, the coupling capacitor remembers the zero velocity occurrences. Additionally, any circuit that employs comparators may also deal with the problem of instability at thresholds. This problem could manifest itself as extra sample pulses, which is bad for the motion control loop and bad for data collection. All of these problems may manifest as misplaced samples within the interferogram.

Figure 15:
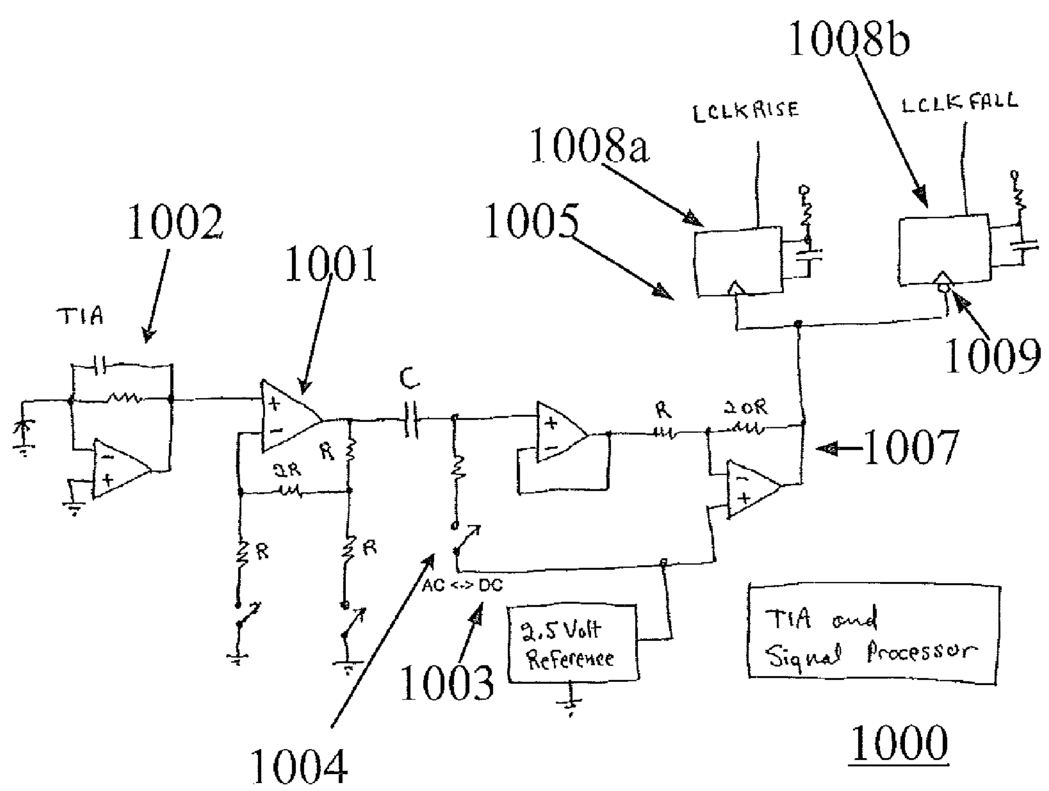
FIG. 15 is a TIA signal processor circuit for use with the quasi-translator, Fourier Modulator, Fourier spectrometer and/or motion control system in accordance with one or more aspects of the present invention.

Now referring to FIG. 15, a schematic illustrates a design solution that addresses the above-identified problems regarding zero velocity occurrences. The circuit solution 1000 to the TIA and signal processor problem may include several elements. The first element of the circuit 1000 is a computer controlled switched gain amplifier 1001 (e.g., such as an operational amplifier or op amp). Because the amplifier 1001 is computer controlled, the gain and speed of the photo diode TIA (transimpedance amplifier) 1002 can remain constant, and a "pot", i.e., a potentiometer, such as, but not limited to, a three-terminal resistor with a sliding contact that operates as a voltage divider, may not require adjusting in the hermetic enclosure accordingly. The provided smoothness of movement allows for, and/or improves, photometric accuracy, consistency (e.g., from system to system and time to time) and stability. Alternatively, the diode TIA 1002 may be a type other than a photo diode.

The second element (generally referenced as 1003 as shown in FIG. 15) of the circuit 1000 is a circuit that can pass AC (also referred to as alternating current) or DC (also referred to as direct current) depending on the state of a computer controlled switch 1004. The basic concept is this: during data collection/generation, when the laser clock 1005 is running at a constant rate, AC coupling is used (i.e., when the switch is closed). This makes the zero crossing detection circuit simple. During turn around and retrace (i.e., when the translator finishes one cycle of movement for the driven element, such as the retroreflector 1, and starts to "turn around" (also referred to as the "snap back") and move the driven element in the opposite direction along the path), DC coupling is used (i.e., when the switch is open). This eliminates the aforementioned charge injection problem. While data may still be generated during turn around, ultra stability for quality of data and/or improving scan cycle efficiency may be provided by stopping data generation during turn around. This is because the velocity of the driven element changes during turn around. Alternatively, in at least one embodiment, data may be generated/collected throughout the entire movement of the driven element, including during turn around, and a processor, such as the TIAX or TIA processor, may compensate for the change in velocity of the driven element so that the data collected is consistent and substantially error free. In addition, the switch 1004 between the AC and DC coupling may occur at positive zero crossings. As a result, only an integral number of sine wave cycles, which have no net DC, may be passed. The laser clock 1005 is coupled to the next stage through a capacitor (C) 1006. Preferably, the capacitor 1006 is a polypropylene capacitor. When the AC/DC switch 1004 is closed, AC coupling occurs. When the switch 1004 is open, DC coupling occurs but only if the capacitor (C) 1006, the switch 1004 and the switched gain amplifier 1001 (e.g., an operational amplifier) all have zero leakage or substantially zero leakage. Real components have leakage, but the components selected may have picoamperes of leakage, which improves the DC approximation. Indeed, the circuit 1000 is quite new and non-obvious due to the fact that creation of the circuit 1000 has only been possible due to the only recent availability of its components.

A major aspect of the circuit 1000 is the elimination of the comparators in comparison to old circuits that require the use of such comparators. The comparators in the circuit 1000 are replaced by a gain of twenty (20) amplifier 1007 and a pair of three (3) microsecond, retriggerable single shots 1008*a*, 1008*b* (best seen in FIG. 15) (single shots may be, but are not limited to, dual precision retriggerable/resettable multivibrators, dual precision retriggerable/resettable monostable multivibrators, etc.). Extra pulses simply retrigger the single shots 1008*a*, 1008*b*, meaning the pulse is lengthened, and not doubled. The single shots 1008*a*, 1008*b* may also have hysteresis. As a result, the response of this circuit 1000 to problematic laser pulses is predictable, and the problem of a sampling pulse occurring on the wrong edge is greatly reduced and/or eliminated. The single shots 1008*a*, 1008*b* may be triggered by a slope, e.g., where the single shot 1008*b* with a "bubble" 1009 on the bottom may be triggered by a negative slope and the single shot 1008*a* without a "bubble" 1009 may be triggered by a positive slope.

As for the "rest of the spectrometer" (e.g., any spectrometer components not already discussed or not discussed herein) (see step 802 in FIG. 13), the motion control system only needs one piece of information from the rest of the spectrometer, i.e., the location of the zero path difference ("ZPD") point. The ZPD point is derived from the signal from the infrared detector (e.g., such as detector 142). ZPD is a number passed to the motion control system 51 at the end of each scan (see e.g., step 804 in FIG. 13), and ZPD effectively labels one of the laser zero crossings.

In at least one embodiment, a computer, such as a 32 bit computer, is dedicated to the control and the monitoring of the motion of the driven element, such as the retroreflector 1, a mirror, reflecting panel, etc. The 32 bit computer directly controls two very accurate 16 bit DACs, 2 fast 12 bit DACs and the TIAX described earlier. The 32 bit computer may also employ an accurate quartz crystal controlled oscillator.

The Frequency to Period Converter ("FPC") is another component of one or more embodiments of the present invention. The FPC compares the laser fringe rate to a reference frequency. An example of a previously used FPC is a FPGA (field programmable gate array). However, while this older FPC may be used, preferably it is replaced when using the PIC 32 because the PIC32 could provide the needed functionality with the use of software. A PIC32 was chosen because it can resolve the timing of interrupts substantially within 12.5 nanoseconds. Laser zero crossings from the TIAX cause interrupts. The FPC compares the laser fringe rate to a reference frequency. The result is a number which is proportional to the velocity error. The velocity error is digitally integrated to become the position error. The FPC works in the following way: First, the time between two successive laser crossings is determined. This number is then compared to the desired rate calculated from the wavelength of the laser and the frequency of the quartz crystal controlled oscillator.

For at least one embodiment of the driving element, e.g., the magnet 5/coil 3 combination, (also referred to as a "rotor motor driver"), the PIC32 discussed above may drive two very accurate 16 bit DACs and two fast 12 bit DACs. Computed values for Gross Position and Offset may be loaded into the 16 bit DACs. Computed values for velocity error and position error may be loaded into the 12 bit DACs. The outputs of all 4 DACs may then be summed and the result may become the input of a power or drive amplifier, such as drive op amp 16. The output of the power amplifier drives the rotor motor. (See e.g., steps 806 and 807 shown in FIG. 13). The weights of the velocity error and position error terms at summation may be critical. The bandwidth and the damping factor of the control loop may depend on the choices. Preferably, using the principles of loop tuning, sample rate jitter and the bandwidth are balanced. For example, sample rate jitter may be low to minimize noise in the spectrum, and the bandwidth may be high to resist vibration.

The computer, such as the PIC 32, may have a seven (7) level prioritized, preemptive interrupt system. In addition, the highest level may have a shadow register set. This means interrupt latency may be only four hundred (400) nanoseconds at the highest level. The FPC makes full use of these capabilities.

A timer may also cause one or more interrupts for the Gross Position generator. While not necessary, preferably, the control loop is entirely interrupt driven in at least one or more embodiments. It may be said that the control loop happens in the background. The foreground is available for various other processes, such as, but not limited to, loop monitoring, interprocessor communication, etc.

When dealing with foreground monitoring, it is important to note that various spectrometers are typically sensitive to vibration and sound. The FPC may be used to monitor the effects of vibration and sound in real time. The amplitude and location of any disturbance which may have occurred during a scan may be saved accordingly. This information may then be used to vet the most recently acquired spectrum. For example, in at least one embodiment, the information may be sent to the other processors via a serial link.

Figure 16:
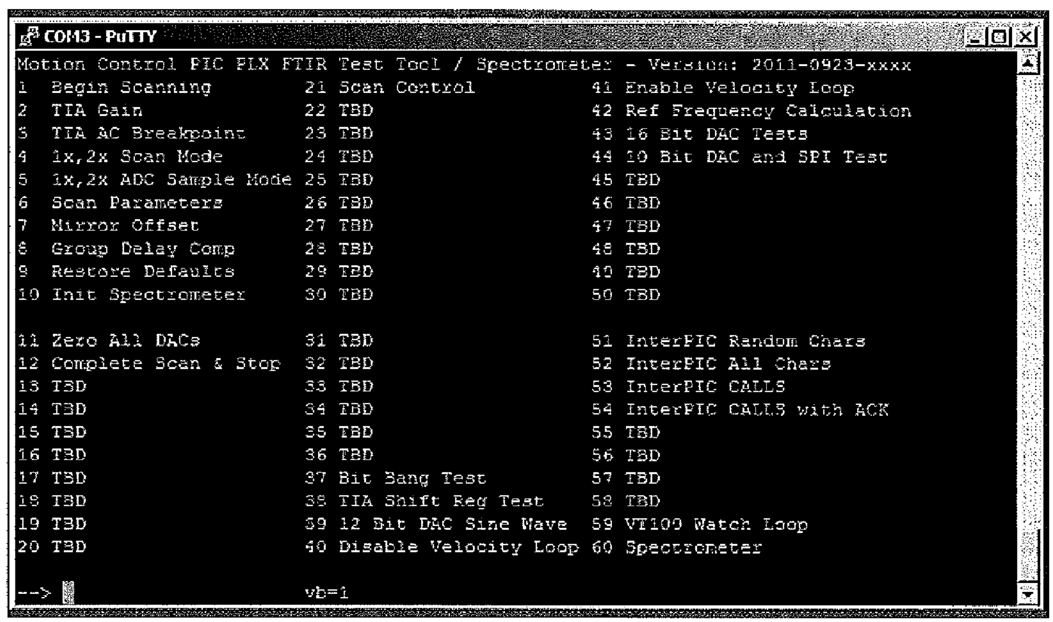
FIG. 16 is an image depicting the main menu for the VT100 protocol in accordance with one or more aspects of the present invention.

The motion control computer, e.g., a PIC 32, may have an additional serial port that uses the VT100 protocol. Typically, the VT100 display is not used for end users, but rather it is used for software and/or hardware development, diagnostics, field service and production. An example of the VT100 display is shown in FIG. 16. Specifically, FIG. 16 depicts the main menu. An oscilloscope and a schematic are needed to make use of the VT100 protocol software in many cases.

A Watch Loop (e.g., provided via the VT100 protocol) provides a real time window into the operation of the motion control loop (see FIG. 13), and it is a useful tool for tuning the control loop. Average laser clock jitter is displayed in real time. Average Jitter is computed in the following way: First, an average of laser intervals is computed. A method is then used that is computationally equivalent to an RC (or resistor-capacitor) network. The average interval is subtracted from the current interval. The absolute differences are summed and divided by the number of intervals summed. Additionally or alternatively, RMS (root mean square) jitter may be computed provided that there is enough computing/processing power to perform this in real time inside the control loop.

As discussed above, various components of the optical assemblies, including the interferometer, are sensitive to external forces, such as, but not limited to vibrations, bumps, etc. A "Thump Detector" may be employed to quantify and locate the bumps in real time, and the watch loop may be used to monitor the operation of the Thump Detector in real time. The collected information may be used as a basis for accepting or rejecting a scan.

Figure 17:
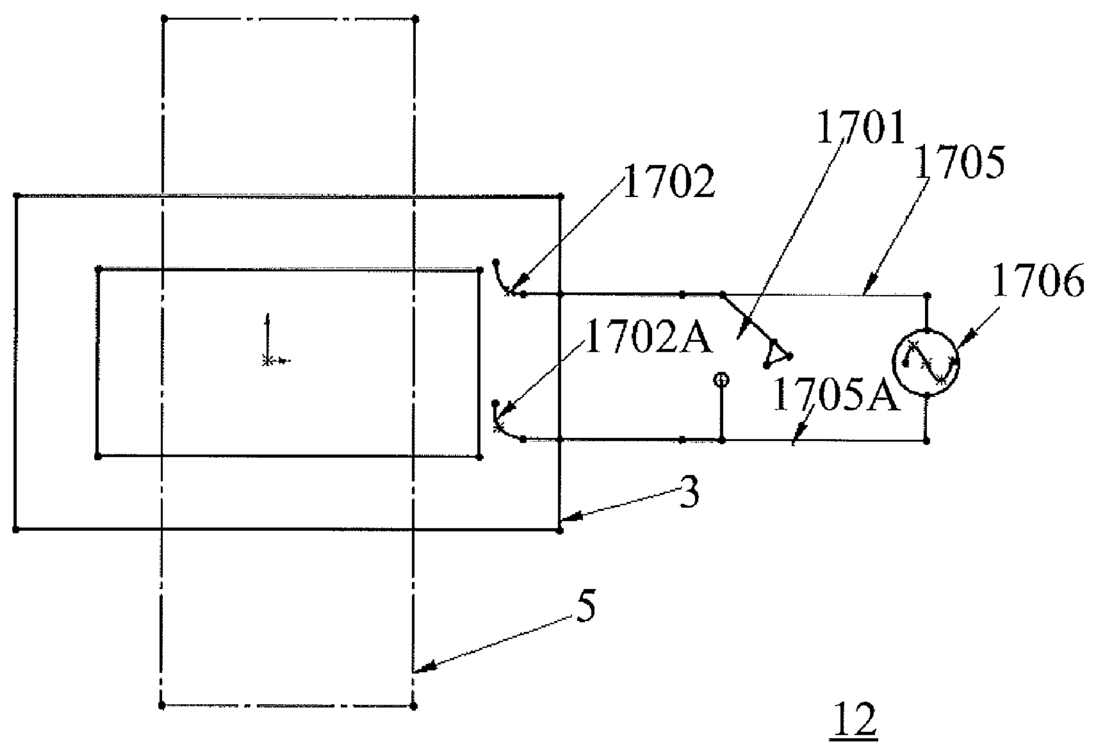
FIG. 17 is a schematic diagram of a driving element in accordance with one or more aspects of the present invention.

Now returning to the details of FIG. 5, the quasi-translator 12 may include a coil shorting board 4 that operates to dampen the motion of the coil 3 (as explained above). To combat various issues that affect optical assemblies, such as, but not limited to, translation issues, flexibility issues, compactness limitations, external forces (e.g., sound, vibrations, stress, etc.), etc., there is a desire to make such assemblies stiff; after all, damping arrangements are known in the art to make such optical assemblies stiff. When the stiffness of a system or assembly increases, it helps to damp the aforementioned forces that may affect the quasi-translator 12 and/or the optical assembly system. However, when systems are designed with rigidity/stiffness (i.e., static structures), they often introduce stress onto components of the system and lack flexibility that may be desirable for certain uses, such as providing the smooth, accurate, substantially error-free movement of optics as discussed above. Thus, the coil shorting board 4 provides structure that permits the movement of the coil 3 of the quasi-translator 12 to be modified in between or during uses depending on the conditions and desired characteristics of the quasi-translator 12 and/or optical assembly in which the quasi-translator 12 is being employed. For example, as explained above, such a relay or coil shorting board 4 operates to damp the coil 3 and/or magnet 5 when one or more of the electronic components are de-energized. The damped energy may be dissipated as heat. This magnetically damps any motion of the arm 6, a portion of the arm 6, the element 19 (such as a rotor), etc. As such, if any motion does occur during movement of the quasi-translator 12 (e.g., such as during shipping), the motion is damped enough such that damage does not occur to one or more components of the quasi-translator 12, such as the arm 6, a portion of the arm 6, the element 19 (such as a rotor), etc. In at least one embodiment of the relay or shorting board 4, a relay switch 1701 may be in the open position (as seen in FIG. 17). The open relay switch 1701 permits an excitation signal 1706 on wires 1705, 1705A to reach the coil 3 via its lead-in wires 1702 and 1702A. The excitation signal 1706 operates to cause magnet 5 to move with respect to the coil 3 (e.g., the magnet 5 may move along the length or larger dimension of the dashed box/square showing the path of magnet 5 such that magnet 5 moves at least one of: up, down, substantially perpendicular to the length or larger dimension of the coil 3, substantially transverse to the length or larger dimension of the coil 3, etc.). When the quasi-translator 12 is being moved (such as switched between systems, shipped to another location, etc.), relay switch 1701 may be closed when there is no applied power for the quasi-translator 12. When the relay switch 1701 is closed, the excitation source 1706 may be substantially zero or zero. As such, the excitation leads 1705, 1705A may remain connected to the excitation source 1706 during such movement of the quasi-translator 12. Alternatively, the excitation leads 1705, 1705A may be disconnected from the excitation source 1706 in at least a further embodiment. Furthermore, when the relay switch 1701 is closed, the coil 3 is a short circuit. As such, vibrational movement of the magnet 5 may induce a voltage and hence a current in the coil 3, which may create a force on the magnet 5 that operates to oppose the vibrational motion/movement. Such opposition is particularly effective as the force is proportional to the velocity of the magnet 5, thereby limiting the velocities (e.g., such as the maximum velocities) that the magnet 5 and its attached optic(s) may achieve. As a result, such opposition operates to prevent excessively damaging or damaging acceleration or deceleration at the limits of motion/travel. The coil shorting board 4 may be easily disconnected from any processor or power supply so that the quasi-translator 12 may be easily transported, inserted into one or more optical assemblies, etc.

Additionally, as best seen in FIG. 5, one or more embodiments of the quasi-translator 12 may employ additional counterweights, such as counterweight 7, as necessary to balance the quasi-translator 12. The counterweight 7 may comprise tungsten and may operate to balance the rotor (e.g., arm 6; a portion of arm 6 that operates to rotate around the axis of rotation, L; element 19 (such as a rotor that may operate to connect the arm 6 or a portion of the arm 6 to the bearing shaft 8) that operates to rotate around the axis of rotation, L, as best seen in FIG. 5; etc.) while maintaining a small front-to-back distance for the quasi-translator (e.g., not much more than the retroreflector depth), thereby allowing the compact and inertially compensated design of the quasi-translator 12.

The quasi-translator 12 may be employed in a Fourier modulator to change the optical path difference of an interferometer/quasi-translator system. Indeed, it is an object of the present invention to provide a Fourier modulator comprising a Michelson interferometer (e.g., Michelson interferometer 100 as shown in FIG. 2), the quasi-translator 12 (e.g., as described above), and control electronics permitting the drive amplifier 16 (e.g., as discussed above) to change the optical path difference of the interferometer/quasi-translator system at a substantially constant rate of change. The Michelson interferometer 100 may be monolithic as discussed above. Additionally or alternatively, the quasi-translator 12 may be used with the interferometer assembly 200' (as best seen in FIGS. 12A-12B), which may be monolithic and may include one or more components that operate in the same or similar fashion to those components as described for assembly 200 above. The quasi-translator 12 and the interferometer 200' may be placed compactly within the hermetic enclosure 1200.

The quasi-translator 12 and/or Fourier modulator may be used in a Fourier spectrometer to create an optical spectrum from a light beam and/or electrical signal created from the light beam (e.g., from the radiation source 110). Indeed, it is a further object of the present invention to provide a Fourier spectrometer comprising a Fourier modulator (e.g., as described above), a broadband beam source (e.g., the radiation source 110) collimated by a first optical system and incident on the Michelson interferometer (e.g., interferometer 100) therein, a second optical system collecting light transmitted by the Michelson interferometer (e.g., interferometer 100) and transmitting it to a sample region, a third optical system collecting light from the sample region and focusing it into a detector region, an optical detector (e.g., such as detector 142 discussed above) located in the detector region converting the transmitted light from the sample region into an electrical signal, and a Fourier analyzer comprising one or more electronics and software that operate to convert the electrical signal into an optical spectrum. Additionally or alternatively, the quasi-translator 12 may be used with the interferometer assembly 200' (as best seen in FIGS. 12A-12B), which may be monolithic and may include one or more components that operate in the same or similar fashion to those components as described for assembly 200 above. The quasi-translator 12 and the interferometer 200' may be placed compactly within the hermetic enclosure 1200.

Any methods of the present invention, such as the method for using the motion control system, may be stored on a computer-readable storage medium. A computer-readable storage medium used commonly, such as, but not limited to, a hard disk, a flash memory, a CD, a DRAM or the like, an optional combination thereof, a server/database, etc. may be used to cause a processor, such as, but not limited to, the at least one processor 17 of the quasi-translator 12, the processor circuit 1000, the processor of any of the aforementioned computers, such as the PIC32, etc., to perform the steps of the methods disclosed herein. The computer-readable storage medium may be a non-transitory computer-readable medium, and/or the computer-readable medium may comprise all computer-readable media, with the sole exception being a transitory, propagating signal. The computer-readable storage medium may include media that store information for predetermined or limited or short period(s) of time and/or only in the presence of power, such as, but not limited to Random Access Memory (RAM), register memory, processor cache(s), etc.

In accordance with at least one aspect of the present invention, the methods, systems, and computer-readable storage mediums related to the processors, such as, but not limited to, the at least one processor 17 of the quasi-translator 12, the processor circuit 1000, the processor of any of the aforementioned computers, such as the PIC32, etc., as described above may be achieved utilizing suitable hardware, such as that illustrated in the figures. Such hardware may be implemented utilizing any of the known technologies, such as standard digital circuitry, any of the known processors that are operable to execute software and/or firmware programs, one or more programmable digital devices or systems, such as programmable read only memories (PROMs), programmable array logic devices (PALs), etc. The processors, such as, but not limited to, the at least one processor 17 of the quasi-translator 12, the processor circuit 1000, the processor of any of the aforementioned computers, such as the PIC32, etc., may also include and/or be made of one or more microprocessors. Still further, the various aspects of the invention may be implemented by way of software and/or firmware program(s) that may be stored on suitable storage medium (e.g., computer-readable storage medium, hard drive, etc.) or media (such as floppy disk(s), memory chip(s), etc.) for transportability and/or distribution.

The present invention also may be used in conjunction with any suitable optical assembly including, but not limited to, optical assembly structures, interferometers, and/or retroreflectors such as those disclosed in U.S. Pat. Nos. 5,335,111; 5,949,543; 6,141,101; 6,473,185; 6,729,735; 6,752,503; 6,786,608; 6,827,455; 6,945,661; 7,168,817; 7,995,208 to Bleier; U.S. Pat. No. 7,268,960 to Vishnia; and U.S. application Ser. No. 11/674,315, filed on Feb. 13, 2007, and Ser. No. 12/505,279, filed on Jul. 17, 2009, (presently pending), each of which patents and applications are incorporated by reference herein in their entireties. One construction for a hollow retroreflector is as disclosed in U.S. Pat. No. 3,663,084 to Morton S. Lipkins.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention.

The invention claimed is:

1. A signal processor circuit, comprising:

a diode transimpedance amplifier;

a potentiometer or a three-terminal resistor with a sliding contact that operates as a voltage divider; and a switched gain amplifier or a drive amplifier, the switched gain amplifier or the drive amplifier being computer-controlled such that the gain and/or speed of the diode transimpedance amplifier remains substantially constant or constant, thereby obtaining smoothness of movement and allowing for, or improving, photometric accuracy, consistency and stability.

2. The signal processor circuit of claim 1, wherein at least one of:

(i) the potentiometer or the three-terminal resistor requires little or no adjustment in a hermetic enclosure that operates to house the signal processor circuit;

(ii) the diode transimpedance amplifier is a photo diode transimpedance amplifier; and (iii) the consistency and stability remains constant or substantially constant at different times and/or between one or more systems with which the circuit interacts.

3. The signal processor circuit of claim 1, further comprising:

a laser clock;

a computer-controlled switch; and an alternating current ("AC") and direct current ("DC") coupling that operates to pass AC or DC depending on the state of the computer-controlled switch, wherein:

(i) when the laser clock is running at a substantially constant or constant rate and when the switch is closed, the AC and DC coupling operates to pass AC, thereby achieving zero crossing detection; and (ii) during a turn around and retrace phase for a quasi-translator when the quasi-translator finishes one cycle of movement for a driven element and moves the driven element in the opposite direction along a path and when the switch is open, the AC and DC coupling operates to pass DC, thereby reducing and/or eliminating one or more laser pulses and/or one or more extra laser pulses that would otherwise occur without the zero crossing detection.

4. The signal processor circuit of claim 3, wherein:

data generation is stopped during the turn around and retrace phase such that stability for quality of date is achieved and/or scan cycle efficiency is improved by ignoring a change of velocity of the driven element that occurs during the turn around and retrace phase; or data generation occurs during the turn around and retrace phase and a processor of the signal processor circuit operates to compensate for the change in the velocity of the driven element so that the data collected is consistent and substantially error-free or error-free.

5. The signal processor circuit of claim 3, wherein the computer-controlled switch is located between the AC and DC coupling and the computer-controlled switch operates to switch between AC and DC at one or more positive zero crossings.

6. The signal processor circuit of claim 3, further comprising a capacitor coupled to the laser clock, wherein the AC and DC coupling operates to pass DC only when the capacitor, the computer-controlled switch and the switched gain amplifier or the drive amplifier all have zero leakage or substantially zero leakage.

7. The signal processor circuit of claim 6, wherein the substantially zero leakage is defined as being picoamperes of leakage, thereby improving the DC approximation.

8. The signal processor circuit of claim 3, further comprising a gain of twenty amplifier and a pair of three microsecond, retriggerable single shots that operate to be retriggered by the one or more laser pulses such that at least one of: (i) the pulse is lengthened and not doubled; and (ii) occurrence of the one or more laser pulses and/or the one or more extra laser pulses is reduced and/or eliminated.

9. The signal processor circuit of claim 8, wherein at least one of:

the single shots use or have hysteresis;

the single shots operate to be triggered by a slope such that a first single shot of the pair of the single shots operates to be triggered by a negative slope and a second single shot of the pair of the single shots operates to be triggered by a positive slope.

10. The signal processor circuit of claim 3, wherein the circuit does not employ one or more comparators such that one or more zero velocity occurrences or one or more laser pulses or one or more extra laser pulses do not affect the quasi-translator and/or the signal processor circuit, thereby improving quality of data collection.

* * * * *